United States Patent
Choi et al.

(10) Patent No.: US 12,082,423 B2
(45) Date of Patent: Sep. 3, 2024

(54) SEMICONDUCTOR DEVICE INCLUDING BLOCKING PATTERN, ELECTRONIC SYSTEM, AND METHOD OF FORMING THE SAME

(71) Applicant: Samsung Electronics Co., Ltd., Suwon-si (KR)

(72) Inventors: Hyunmook Choi, Suwon-si (KR); Jooheon Kang, Seoul (KR); Sanghoon Kim, Hwaseong-si (KR); Jihong Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 304 days.

(21) Appl. No.: 17/679,863

(22) Filed: Feb. 24, 2022

(65) Prior Publication Data

US 2023/0077589 A1    Mar. 16, 2023

(30) Foreign Application Priority Data

Sep. 10, 2021    (KR) .......................... 10-2021-0120905

(51) Int. Cl.
   *H10B 63/00*        (2023.01)
(52) U.S. Cl.
   CPC .................................... *H10B 63/34* (2023.02)
(58) Field of Classification Search
   CPC ..................................................... H10B 63/34
   See application file for complete search history.

(56) References Cited

U.S. PATENT DOCUMENTS

| | | | |
|---|---|---|---|
| 8,148,769 B2 | 4/2012 | Kito et al. | |
| 8,148,789 B2 | 4/2012 | Kito et al. | |
| 8,350,314 B2 | 1/2013 | Fukuzumi et al. | |
| 8,455,940 B2 | 6/2013 | Lee et al. | |
| 8,847,303 B2 | 9/2014 | Kito et al. | |
| 9,093,369 B2 | 7/2015 | Shin et al. | |
| 10,217,795 B1 | 2/2019 | Franca-Neto et al. | |
| 10,903,235 B2 | 1/2021 | Yoon et al. | |
| 2015/0162383 A1 | 6/2015 | Hwang | |
| 2020/0395412 A1* | 12/2020 | Lee | G11C 16/10 |
| 2021/0035635 A1 | 2/2021 | Yoon et al. | |

FOREIGN PATENT DOCUMENTS

KR        101355622 B1     1/2014

* cited by examiner

*Primary Examiner* — Douglas M Menz
(74) *Attorney, Agent, or Firm* — Muir Patent Law, PLLC

(57) ABSTRACT

A semiconductor device includes a horizontal wiring layer on a substrate, a stack structure disposed on the horizontal wiring layer and including insulating layers and electrode layers alternately stacked on each other, and a pillar structure extending into the horizontal wiring layer and extending through the stack structure. The electrode layers include one or a plurality of selection lines adjacent to an uppermost end of the stack structure, and word lines surrounding the stack structure below the one or plurality of selection lines. The pillar structure includes a variable resistive layer, a channel layer between the variable resistive layer and the stack structure, a gate dielectric layer between the channel layer and the stack structure, and a blocking pattern disposed between the variable resistive layer and the channel layer and being adjacent to a first selection line among the one or plurality of selection lines.

20 Claims, 23 Drawing Sheets

SEMICONDUCTOR DEVICE INCLUDING BLOCKING PATTERN, ELECTRONIC SYSTEM, AND METHOD OF FORMING THE SAME

CROSS-REFERENCE TO THE RELATED APPLICATION

This non-provisional patent application claims priority under 35 U.S.C. § 119 from Korean Patent Application No. 10-2021-0120905, filed on Sep. 10, 2021, in the Korean Intellectual Property Office, the disclosure of which is incorporated herein by reference in its entirety.

BACKGROUND

1. Field

The exemplary embodiments of the disclosure relate to a semiconductor device including a blocking pattern, an electronic system including the same, and a method of forming the same.

2. Description of the Related Art

In accordance with high integration of a semiconductor device, technology using a stack structure and a pillar structure extending through (i.e., penetrating) the stack structure is being attempted. The stack structure may include a plurality of insulating layers and a plurality of wiring layers alternately stacked on each other. The plurality of wiring layers may include a selection line. Leakage current of the pillar structure in a region adjacent to the selection line may cause failure of characteristics of the semiconductor device.

SUMMARY

The exemplary embodiments of the disclosure provide semiconductor devices having excellent electrical characteristics, an electronic system including the same, and a method of forming the same.

According to an embodiment of the present invention, a semiconductor device includes a horizontal wiring layer on a substrate, a stack structure disposed on the horizontal wiring layer and including a plurality of insulating layers and a plurality of electrode layers alternately stacked on each other, and a pillar structure extending into the horizontal wiring layer and extending through the stack structure. The plurality of electrode layers include one or a plurality of selection lines adjacent to an uppermost end of the stack structure, and a plurality of word lines surrounding the stack structure below the one or plurality of selection lines. The pillar structure includes a variable resistive layer, a channel layer between the variable resistive layer and the stack structure, a gate dielectric layer between the channel layer and the stack structure, and a blocking pattern disposed between the variable resistive layer and the channel layer and being adjacent to a first selection line among the one or plurality of selection lines. The channel layer is disposed between the first selection line and the blocking pattern.

According to an embodiment of the present invention, a semiconductor device includes a stack structure including a plurality of insulating layers and a plurality of electrode layers alternately stacked on each other, and a pillar structure disposed on a side surface of the stack structure. The pillar structure includes a variable resistive layer, a channel layer between the variable resistive layer and the stack structure, a gate dielectric layer between the channel layer and the stack structure, and a blocking pattern disposed between the variable resistive layer and the channel layer and being adjacent to an uppermost electrode layer of the plurality of electrode layers.

According to an embodiment of the present invention, an electronic system includes a semiconductor device, and a controller disposed adjacent to the semiconductor device and being electrically connected to the semiconductor device. The semiconductor device includes a horizontal wiring layer on a substrate, a stack structure disposed on the horizontal wiring layer, the stack structure including a plurality of insulating layers and a plurality of electrode layers alternately stacked on each other, and a pillar structure extending into the horizontal wiring layer and extending through the stack structure. The plurality of electrode layers include one or a plurality of selection lines adjacent to an uppermost end of the stack structure, and a plurality of word lines surrounding the stack structure below the one or plurality of selection lines. The pillar structure includes a variable resistive layer, a channel layer between the variable resistive layer and the stack structure, a gate dielectric layer between the channel layer and the stack structure, and a blocking pattern disposed between the variable resistive layer and the channel layer and being adjacent to a first selection line among the one or plurality of selection lines.

DETAILED DESCRIPTION OF EXEMPLARY EMBODIMENTS

FIGS. 1 to 5 are sectional views explaining semiconductor devices according to exemplary embodiments of the disclosure. In an embodiment, FIG. 1 may be a partial view showing portions I, II and III of FIG. 2. The semiconductor devices according to the exemplary embodiments of the disclosure may include a non-volatile memory such as resistive random access memory (ReRAM), resistive switching memory, and resistive VNAND (ReVNAND). The semiconductor devices according to the exemplary embodiments of the disclosure may include a cell-on-peripheral (COP) structure. As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Semiconductor packages may include a package substrate, one or more semiconductor chips, and an encapsulant formed on the package substrate and covering the semiconductor chips.

Figure 1:
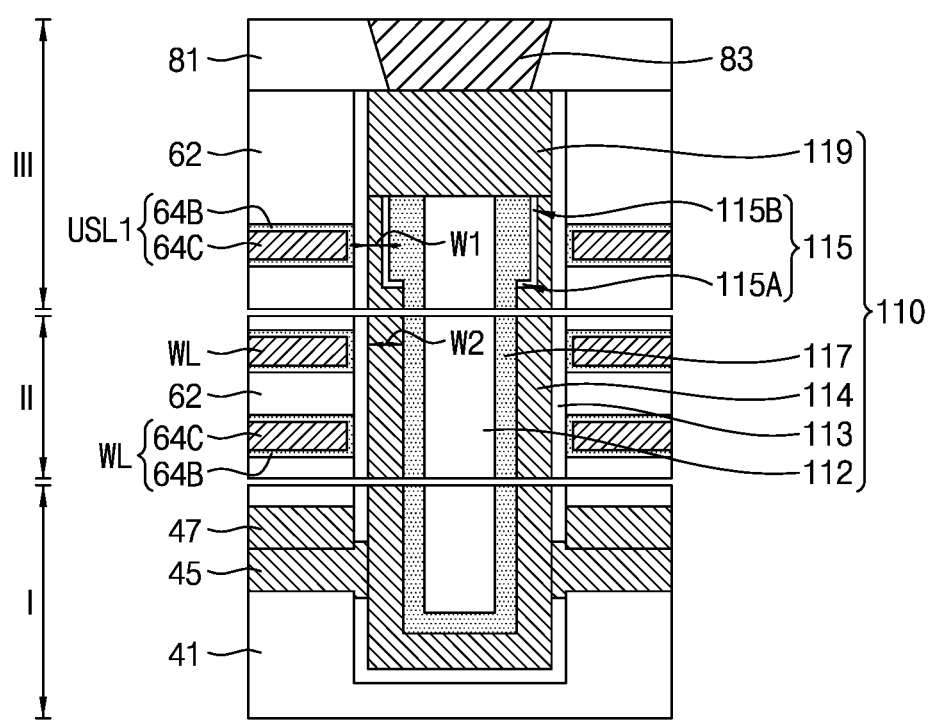
FIGS. 1 to 5 are sectional views explaining semiconductor devices according to exemplary embodiments of the disclosure.

Referring to FIG. 1, the semiconductor devices according to the exemplary embodiments of the disclosure may include a horizontal conductive layer 41, a sealing conductive layer 45, a support 47, a plurality of insulating layers 62, a plurality of word lines WL, a first upper selection line USL1, an upper insulating layer 81, a bit plug 83, and a pillar structure 110.

The pillar structure 110 may include a core pattern 112, a gate dielectric layer 113, a channel layer 114, a blocking pattern 115, a variable resistive layer 117, and a pad 119. The blocking pattern 115 may include a first portion 115A and a second portion 115B. Each of the plurality of word lines WL and the first upper selection line USL1 may include a conductive layer 64C and a barrier layer 64B.

Figure 2:
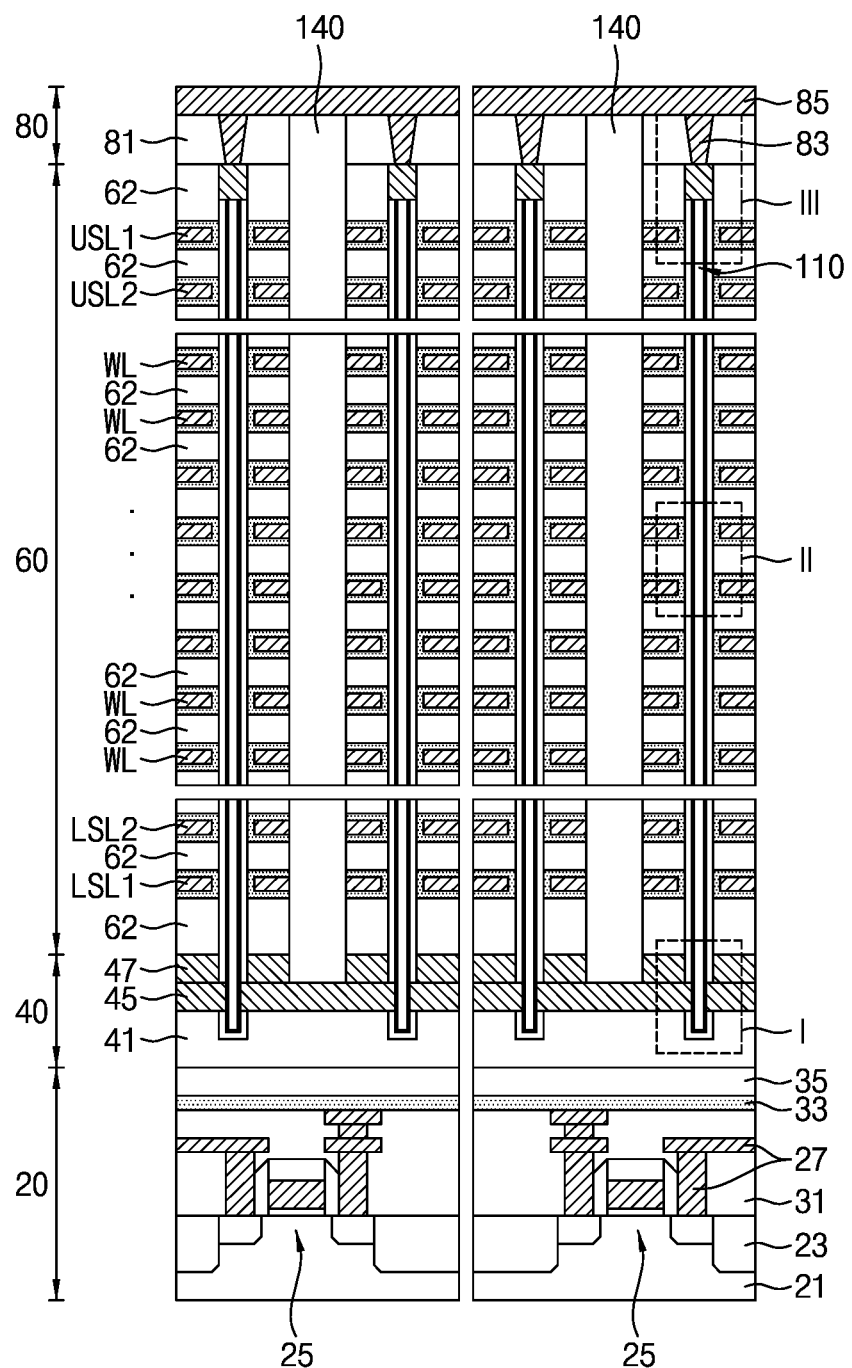

Referring to FIG. 2, the semiconductor devices according to the exemplary embodiments of the disclosure may include a lower structure 20, a horizontal wiring layer 40, a stack structure 60, an upper structure 80, a plurality of pillar structures 110, and a plurality of separation insulating patterns 140.

The lower structure 20 may include a substrate 21, an element isolation layer 23, a plurality of transistors 25, a plurality of lower wirings 27, a first lower insulating layer 31, a second lower insulating layer 33, and a third lower insulating layer 35. The horizontal wiring layer 40 may include a horizontal conductive layer 41, a sealing conductive layer 45, and a support 47. In an embodiment, the horizontal conductive layer 41 may correspond to a common source line. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The stack structure 60 may include a plurality of insulating layers 62 and a plurality of electrode layers LSL1, LSL2, WL, USL1 and USL2. The plurality of insulating layers 62 and the plurality of electrode layers LSL1, LSL2, WL, USL1 and USL2 may be repeatedly and alternately stacked on each other. An uppermost one of the plurality of insulating layers 62 may be thicker than one, adjacent to the center of the stack structure 60, of the plurality of insulating layers 62. In an embodiment, the plurality of electrode layers LSL1, LSL2, WL, USL1 and USL2 may include one or a plurality of lower selection lines LSL1 and LSL2, a plurality of word lines WL, and one or a plurality of upper selection lines USL1 and USL2.

For example, the one or plurality of lower selection lines LSL1 and LSL2 may include a first lower selection line LSL1 and a second lower selection line LSL2. At least one of the first lower selection line LSL1 and the second lower selection line LSL2 may correspond to a ground selection line. The one or plurality of upper selection lines USL1 and USL2 may include a first upper selection line USL1 and a second upper selection line USL2. At least one of the first upper selection line USL1 and the second upper selection line USL2 may correspond to a string selection line.

The upper structure 80 may include an upper insulating layer 81, a plurality of bit plugs 83, and a plurality of bit lines 85.

Referring to FIGS. 1 and 2, the horizontal wiring layer 40 may be disposed on the lower structure 20. The horizontal wiring layer 40 may include the horizontal conductive layer 41 on the lower structure 20, the sealing conductive layer 45 on the horizontal conductive layer 41, and the support 47 on the sealing conductive layer 45. The sealing conductive layer 45 may contact the horizontal conductive layer 41 and the support 47. The sealing conductive layer 45 may contact a side surface of the channel layer 114 while extending through a side surface of the gate dielectric layer 113. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The stack structure 60 may be disposed on the horizontal wiring layer 40. The one or plurality of upper selection lines USL1 and USL2 may be disposed adjacent to an uppermost end of the stack structure 60. For example, the first upper selection line USL1 may correspond to one, nearest to the uppermost end of the stack structure 60, of the plurality of electrode layers LSL1, LSL2, WL, USL1 and USL2. The first upper selection line USL1 may correspond to an uppermost one of the plurality of electrode layers LSL1, LSL2, WL, USL1 and USL2. The first upper selection line USL1 may correspond to one, farthest from the horizontal wiring layer 40, of the plurality of electrode layers LSL1, LSL2, WL, USL1 and USL2. The second upper selection line USL2 may correspond to one, nearest to the first upper selection line USL1, of the plurality of electrode layers LSL1, LSL2, WL, USL1 and USL2.

The one or plurality of lower selection lines LSL1 and LSL2 may be adjacent to a lowermost end of the stack structure 60. For example, the first lower selection line LSL1 may correspond to one, nearest to the support 47, of the plurality of electrode layers LSL1, LSL2, WL, USL1 and USL2. The second lower selection line LSL2 may correspond to one, nearest to the first lower selection line LSL1, of the plurality of electrode layers LSL1, LSL2, WL, USL1 and USL2.

The plurality of word lines WL may be disposed between the one or plurality of lower selection lines LSL1 and LSL2 and the one or plurality of upper selection lines USL1 and USL2. The plurality of word lines WL may be adjacent to the center of the stack structure 60. In an embodiment, each of the plurality of word lines WL may surround (i.e., wrap around) the stack structure 60 below the one or the plurality of upper selection lines USL1 and USL2.

Each of the plurality of pillar structures 110 may extend into the horizontal wiring layer 40 while extending through the stack structure 60. In an embodiment, a lower end of the each of the plurality of pillar structures 110 may be buried in the horizontal conductive layer 41. In an embodiment, each of the plurality of pillar structures 110 may be disposed on a side surface of the stack structure 60. The variable resistive layer 117 may surround an outside of the core pattern 112. The variable resistive layer 117 may surround a side wall and a bottom of the core pattern 112. The variable resistive layer 117 may be disposed between the core pattern 112 and the stack structure 60.

The variable resistive layer 117 may include or may be formed of HfO, NiO, CuO, CoO, $Fe_2O_3$, $TiO_2$, $Ta_2O_5$, $Nb_2O_5$, $SrTiO_3$(STO), $SrZrO_3$, AlO, SiO, SiN, lanthanum strontium manganese oxide (LSMO), lanthanum calcium manganese oxide (LCMO), praseodymium calcium manganese oxide (PCMO), praseodymium lanthanum calcium manganese oxide (PLCMO), yttrium barium copper oxide (YBCO), bismuth strontium calcium copper oxide (BSCCO), Bi:SrTiO$_3$, Cr:SrTiO$_3$, HfSiO, AlSiO, WO, Mott, GeSbTe, C-doped GeSbTe, N-doped GeSbTe, SnSbTe, GeAsTe, GeSbSe, (GeTe)(Sb$_2$Te$_3$), Zr60Al15Ni25, Fe—Co—B—Si—Nb, or a combination thereof. In an embodiment, the variable resistive layer 117 may include or may be formed of a transition metal oxide such as HfO, HfSiO, and a combination thereof.

The channel layer 114 may surround an outside of the variable resistive layer 117. The channel layer 114 may surround a side wall and a bottom of the variable resistive layer 117. The channel layer 114 may be disposed between the variable resistive layer 117 and the stack structure 60. The gate dielectric layer 113 may surround an outside of the channel layer 114. The gate dielectric layer 113 may surround a side wall and a bottom of the channel layer 114. The gate dielectric layer 113 may be disposed between the channel layer 114 and the stack structure 60.

The blocking pattern 115 may be disposed between the channel layer 114 and the variable resistive layer 117. The blocking pattern 115 may be adjacent to the one or plurality of upper selection lines USL1 and USL2. In an embodiment, the blocking pattern 115 may be adjacent to the first upper selection line USL1. In an embodiment, the first upper selection line USL1 may wrap around the blocking pattern 115.

A lowermost end of the blocking pattern 115 may extend to a lower level than a lowermost end of the one or plurality of upper selection lines USL1 and USL2. For example, the lowermost end of the blocking pattern 115 may extend to a lower level than a lowermost end of the first upper selection line USL1. An uppermost end of the blocking pattern 115 may extend to a higher level than an uppermost end of the one or plurality of upper selection lines USL1 and USL2. For example, the uppermost end of the blocking pattern 115 may extend to a higher level than an uppermost end of the first upper selection line USL1.

The blocking pattern 115 may include an L shape, a bar shape, or a combination thereof. In an embodiment, the blocking pattern 115 may include the first portion 115A, and the second portion 115B in continuity with the first portion 115A. The first portion 115A may have a horizontal width greater than a vertical height thereof. The second portion 115B may have a vertical height greater than a horizontal width thereof. In an embodiment, the first portion 115A may extend in a first horizontal direction and having a horizontal width greater than a vertical height, and the second portion 115B may be connected to an end of the first portion 115A. The second portion 115B vertically extends from the end of the first portion, and may have a vertical height greater than a horizontal width.

The blocking pattern 115 may include or may be formed of an air gap, a material having greater resistivity than the channel layer, a material having greater resistivity than the variable resistive layer, or a combination thereof. In some embodiments, the blocking pattern 115 may include or may be formed of an insulating material such as silicon oxide, silicon nitride, silicon oxynitride, silicon boron nitride (SiBN), silicon carbon nitride (SiCN), metal oxide, metal nitride, metal silicate, low-k dielectrics, high-k dielectrics, and a combination thereof. The phrase "air gap" will be understood to include gaps (e.g., pockets) of air or gases other than air, such as other atmospheric gases or chamber gases that may be present during manufacturing. An "air gap" may also constitute a space having no or substantially no gas or other material therein."

The pad 119 may be disposed on the core pattern 112, the channel layer 114, the blocking pattern 115 and the variable resistive layer 117. The pad 119 may contact the channel layer 114.

The variable resistive layer 117 may contact the channel layer 114 which is positioned at a horizontal line passing through the plurality of word lines WL. The blocking pattern 115 may be interposed between the channel layer 114 which is positioned at a horizontal line passing through the one or plurality of upper selection lines USL1 and USL2 and the variable resistive layer 117. For example, the blocking pattern 115 may be interposed between the channel layer 114 which is positioned at a horizontal line passing through the first upper selection line USL1 and the variable resistive layer 117.

The channel layer 114 may have a first width W1 on the horizontal line passing through the one or plurality of upper selection lines USL1 and USL2. For example, the channel layer 114 may have the first width W1 on the horizontal line passing through the first upper selection line USL1. The channel layer 114 may have a second width W2 on a horizontal line passing through the plurality of word lines WL. The first width W1 may be smaller than the second width W2. The first width W1 may be 0.5 to 3 nm (nanometers). The second width W2 may be 1 to 7 nm. For example, the first width W1 may be about 2 nm, and the second width W2 may be about 5 nm. In an embodiment, the channel layer 114 may have a first portion with a first width W1, the first portion of the channel layer 114 being positioned at a horizontal line passing through the first selection line USL1, and a second portion with a second width W2, the second portion of the channel layer being positioned at a horizontal line passing through a first word line among the plurality of word lines WL. The first width W1 may be smaller than the second width W2. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In accordance with the exemplary embodiments of the disclosure, the blocking pattern 115 may function to block leakage current. For example, the blocking pattern 115 may function to block leakage current flowing through an interface between the variable resistive layer 117 and the channel layer 114. When the one or plurality of upper selection lines USL1 and USL2 is in an OFF state, leakage current between the plurality of bit lines 85 and the horizontal conductive layer 41 may be remarkably reduced by the blocking pattern 115.

Figure 3:
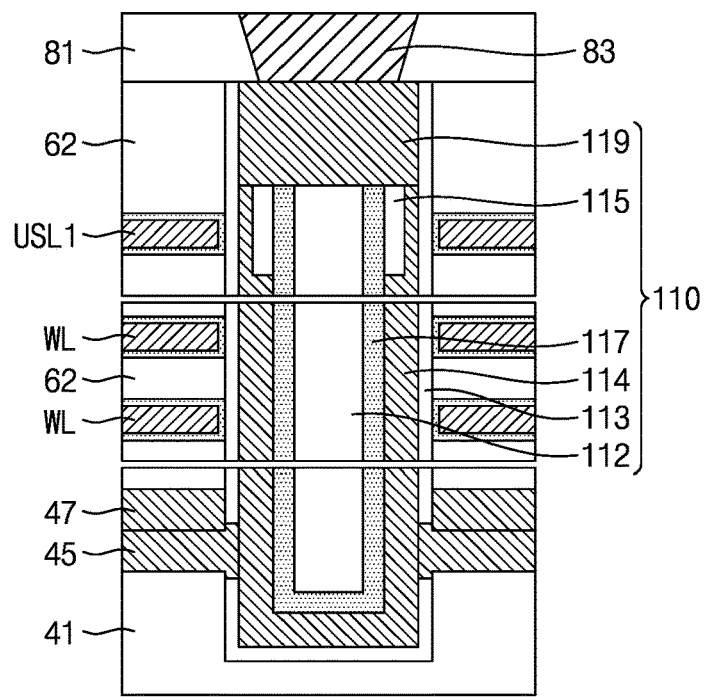

Referring to FIG. 3, the blocking pattern 115 may include a bar shape. The blocking pattern 115 may have a vertical height greater than a horizontal width. The blocking pattern 115 may contact the channel layer 114, the variable resistive layer 117, and the pad 119.

Figure 4:
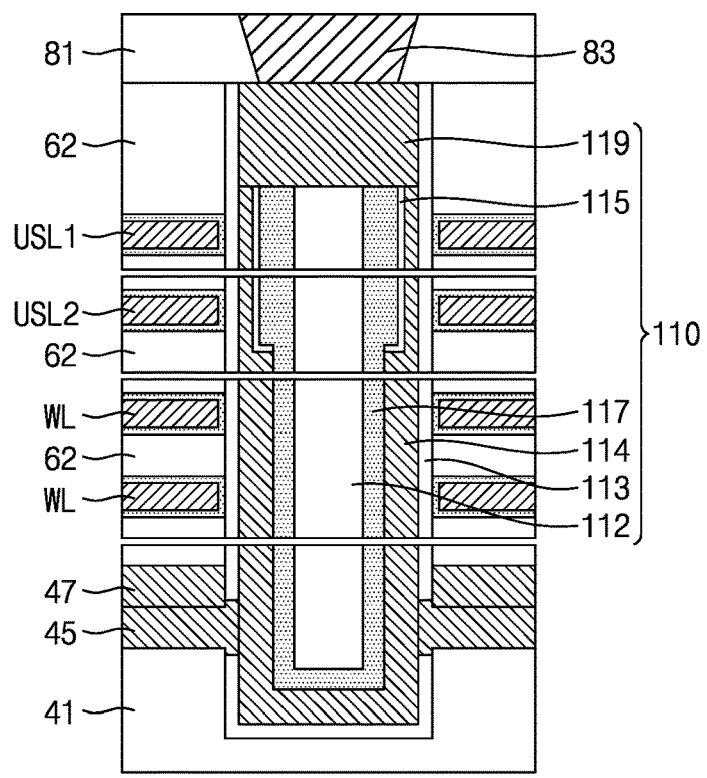

Referring to FIG. 4, one or a plurality of upper selection lines USL1 and USL2 may include a first upper selection line USL1 and a second upper selection line USL2. In an embodiment, the one or plurality of upper selection lines USL1 and USL2 may include one or a plurality of other selection lines (not shown) disposed between the first upper selection line USL1 and the second upper selection line USL2.

A lowermost end of a blocking pattern 115 may extend to a lower level than a lowermost end of the one or plurality of upper selection lines USL1 and USL2. For example, the lowermost end of the blocking pattern 115 may extend to a lower level than a lowermost end of the second upper selection line USL2. In an embodiment, the lowermost end of the blocking pattern 115 may be disposed below a bottom surface of the second upper selection line USL2. An uppermost end of the blocking pattern 115 may extend to a higher level than an uppermost end of the one or plurality of upper selection lines USL1 and USL2. For example, the uppermost end of the blocking pattern 115 may extend to a higher level than an uppermost end of the first upper selection line USL1. In an embodiment, the uppermost end of the blocking pattern 115 may be disposed higher a top surface of the first upper selection line USL1.

Figure 5:
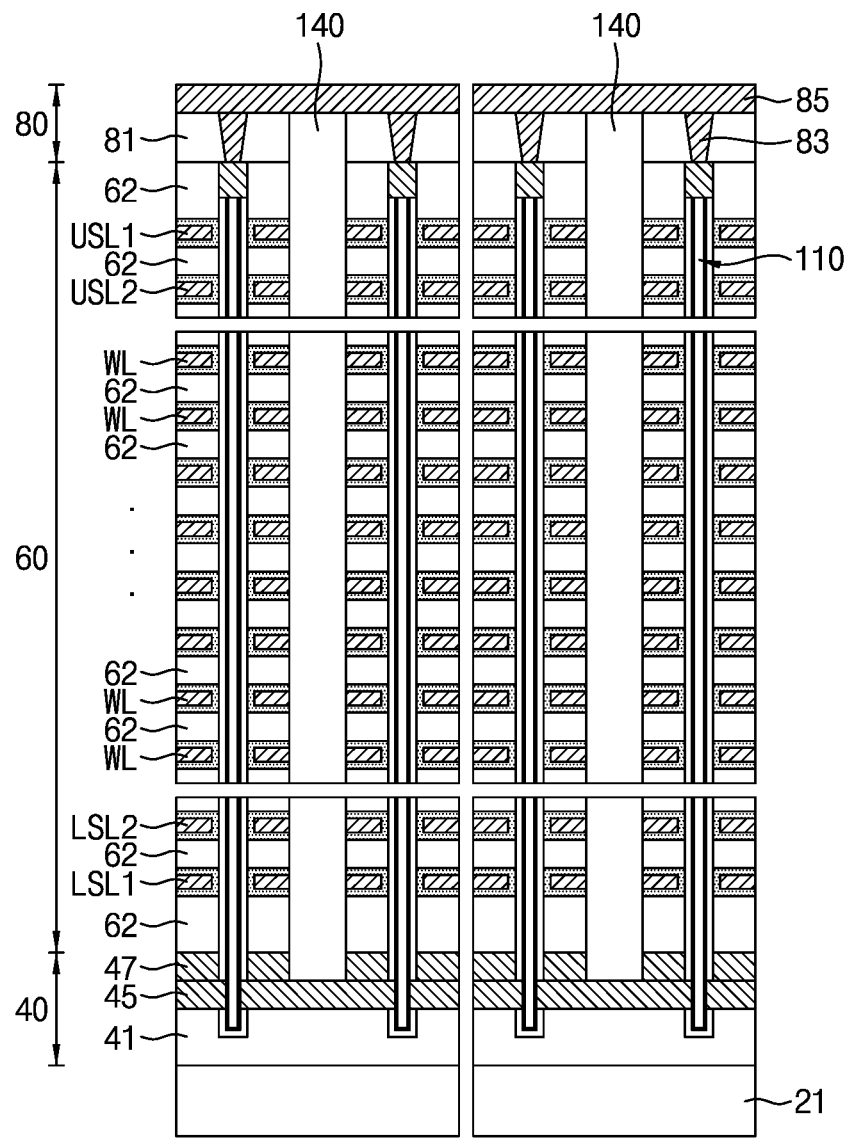

Referring to FIG. 5, a horizontal conductive layer 41 may be disposed on a substrate 21. In an embodiment, the horizontal conductive layer 41 may be formed by implanting N-type impurity ions in the substrate 21. A sealing conductive layer 45 may be disposed on the horizontal conductive layer 41. A support 47 may be disposed on the sealing conductive layer 45.

FIGS. 6 to 26 are sectional views explaining semiconductor device formation methods according to exemplary embodiments of the disclosure.

Figure 6:
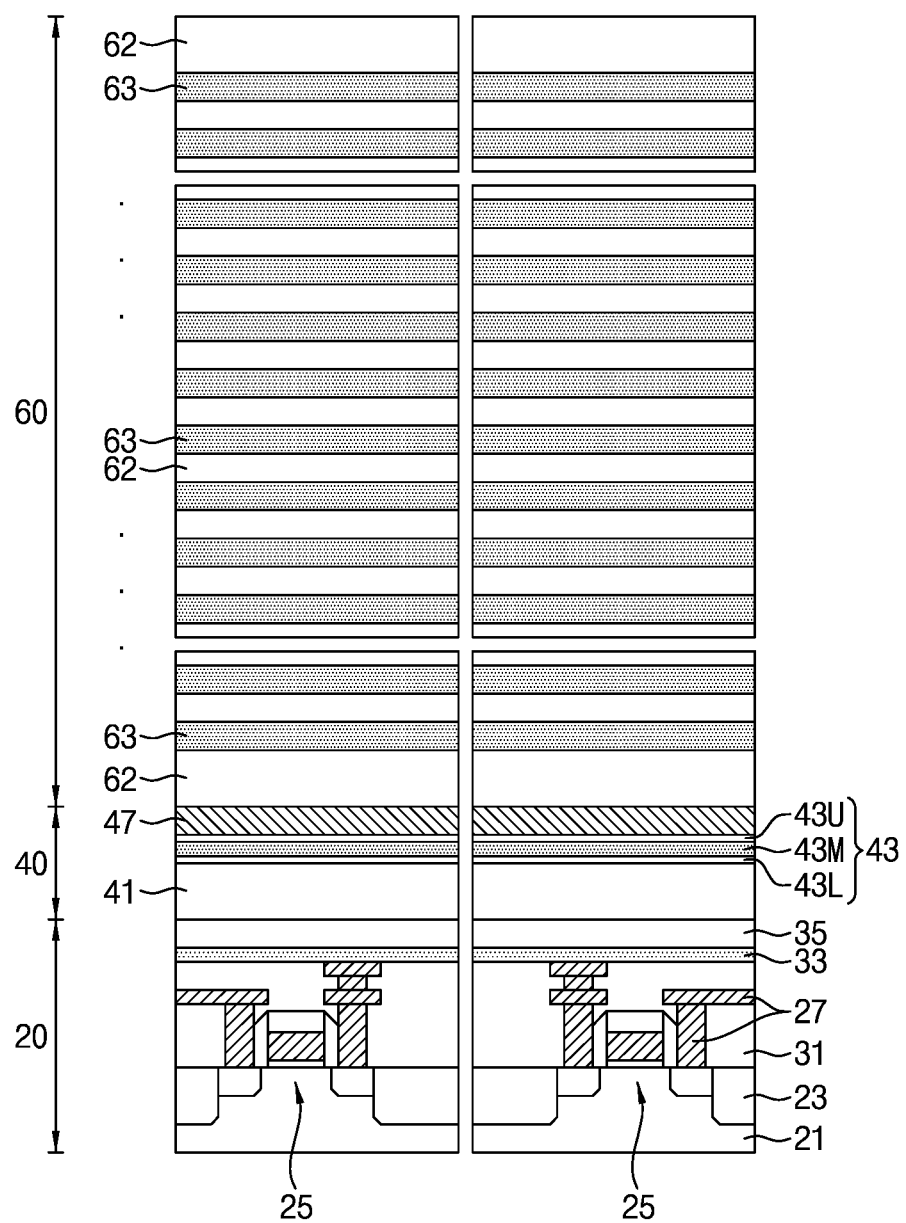
FIGS. 6 to 26 are sectional views explaining semiconductor device formation methods according to exemplary embodiments of the disclosure.

Referring to FIG. 6, a horizontal wiring layer 40 may be formed on a lower structure 20. A stack structure 60 may be formed on the horizontal wiring layer 40.

The lower structure 20 may include a substrate 21, an element isolation layer 23, a plurality of transistors 25, a plurality of lower wirings 27, a first lower insulating layer 31, a second lower insulating layer 33, and a third lower insulating layer 35. The horizontal wiring layer 40 may include a horizontal conductive layer 41, a horizontal mold layer 43, and a support 47. The horizontal mold layer 43 may include a lower mold layer 43L, a middle mold layer 43M, and an upper mold layer 43U. The stack structure 60 may include a plurality of insulating layers 62 and a plurality of mold layers 63 which are repeatedly alternately stacked.

The substrate 21 may include or may be a semiconductor substrate such as a silicon wafer and a silicon-on-insulator (SOI) wafer. The element isolation layer 23 may be formed in the substrate 21 using a trench isolation method. The plurality of transistors 25 may be formed in the substrate 21 and/or on the substrate 21 through various methods. The plurality of transistors 25 may be a planar transistor, a fin field effect transistor (FinFET), a multi-bridge channel transistor such as MBCFET®, a nanowire transistor, a vertical transistor, a recess channel transistor, a 3-D transistor, or a combination thereof.

The first lower insulating layer 31 may be formed on the substrate 21, to cover the element isolation layer 23 and the plurality of transistors 25. The plurality of lower wirings 27 may be formed in the first lower insulating layer 31. The plurality of lower wirings 27 may include or may be formed of conductive patterns such as a plurality of horizontal wirings, a plurality of vertical wirings and a plurality of connection pads. Some of the plurality of lower wirings 27 may be connected to a corresponding one of the plurality of transistors 25. The plurality of transistors 25 and the plurality of lower wirings 27 may constitute a peripheral circuit.

The second lower insulating layer 33 may be formed to cover the first lower insulating layer 31 and the plurality of lower wirings 27 in plan view. The third lower insulating layer 35 may be formed on the second lower insulating layer 33. The second lower insulating layer 33 may include or may be formed of a material having etch selectivity with respect to the third lower insulating layer 35. The second lower insulating layer 33 may correspond to an etch stop layer.

Each of the element isolation layer 23, the first lower insulating layer 31, the second lower insulating layer 33 and the third lower insulating layer 35 may include or may be formed of a single layer or multiple layers. Each of the element isolation layer 23, the first lower insulating layer 31, the second lower insulating layer 33 and the third lower insulating layer 35 may include or may be formed of silicon oxide, silicon nitride, silicon oxynitride, silicon boron nitride (SiBN), silicon carbon nitride (SiCN), low-k dielectrics, high-k dielectrics, or a combination thereof. In an embodiment, the second lower insulating layer 33 may include or may be formed of silicon nitride, silicon oxynitride, silicon boron nitride (SiBN), silicon carbon nitride (SiCN), or a combination thereof. The first lower insulating layer 31 and the third lower insulating layer 35 may include or may be formed of silicon oxide. The plurality of lower wirings 27 may include or may be formed of a single layer or multiple layers. The plurality of lower wirings 27 may include or may be formed of a conductive material such as metal, metal nitride, metal oxide, metal silicide, conductive carbon, polysilicon, amorphous silicon, monocrystalline silicon, and a combination thereof.

The horizontal conductive layer 41 may be formed on the third lower insulating layer 35. The horizontal conductive layer 41 may include or may be formed of a single layer or multiple layers. The horizontal conductive layer 41 may include or may be formed of a conductive material such as metal, metal nitride, metal oxide, metal silicide, conductive carbon, polysilicon, amorphous silicon, monocrystalline silicon, and a combination thereof. In an embodiment, the horizontal conductive layer 41 may include or may be formed of a conductive layer such as a polysilicon layer including N-type impurities and a monocrystalline semiconductor layer including N-type impurities.

The horizontal mold layer 43 may be formed on the horizontal conductive layer 41. The horizontal mold layer 43 may include or may be formed of a material having etch selectivity with respect to the horizontal conductive layer 41 and the support 47. The middle mold layer 43M may be disposed between the lower mold layer 43L and the upper mold layer 43U. The middle mold layer 43M may include or may be formed of a material having etch selectivity with respect to the lower mold layer 43L and the upper mold layer 43U. In an embodiment, the middle mold layer 43M may include or may be formed of silicon nitride, and each of the lower mold layer 43L and the upper mold layer 43U may include or may be formed of silicon oxide. The support 47 may be formed on the horizontal mold layer 43. In an embodiment, the support 47 may include or may be formed of polysilicon.

The plurality of mold layers 63 may include or may be formed of a material having etch selectivity with respect to the plurality of insulating layers 62. In an embodiment, the plurality of insulating layers 62 may include or may be formed of silicon oxide, and the plurality of mold layers 63 may include or may be formed of silicon nitride. An uppermost one of the plurality of insulating layers 62 may be thicker than one, adjacent to the center of the stack structure 60, of the plurality of insulating layers 62.

Figure 7:
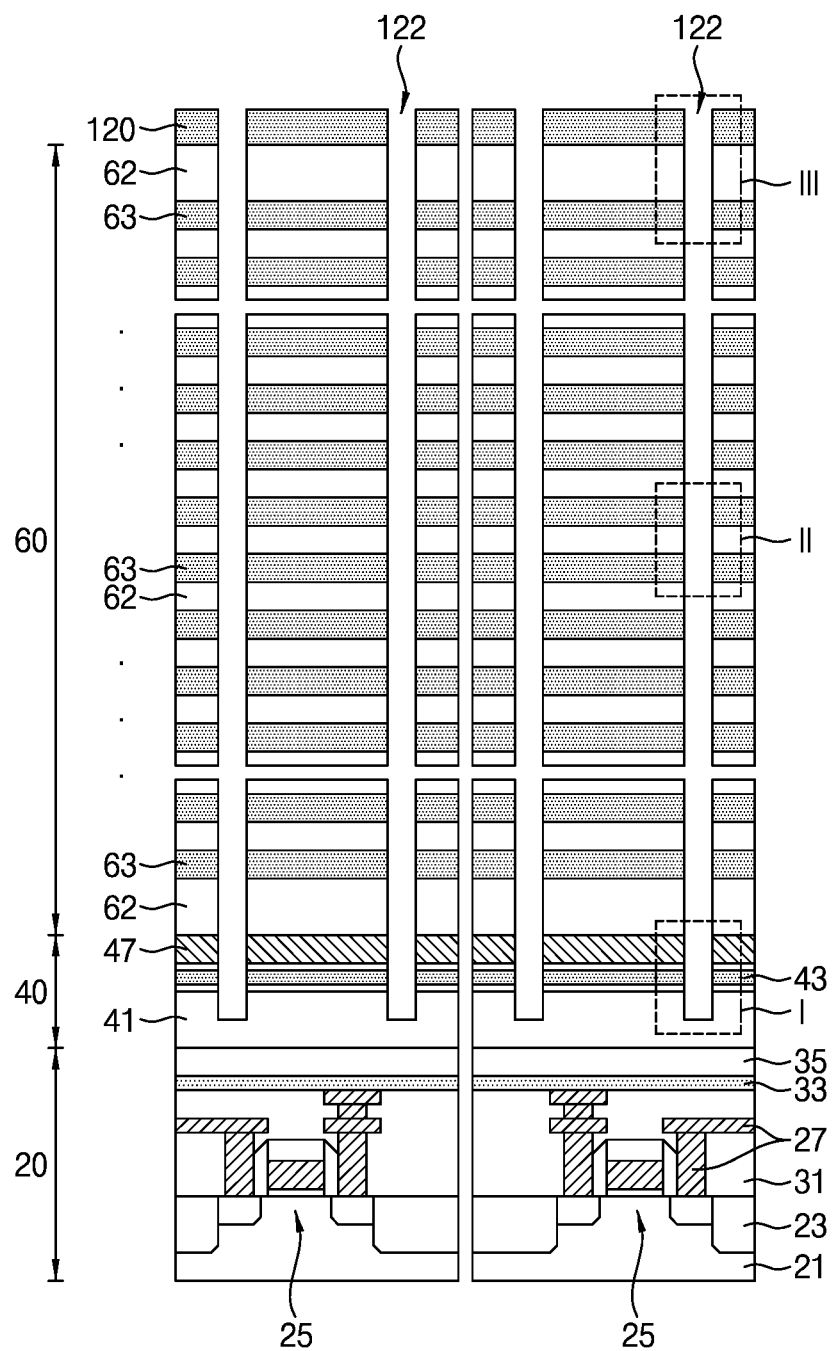

FIGS. 8 to 15 may be partial views showing portions I, II and III of FIG. 7.

Figure 8:
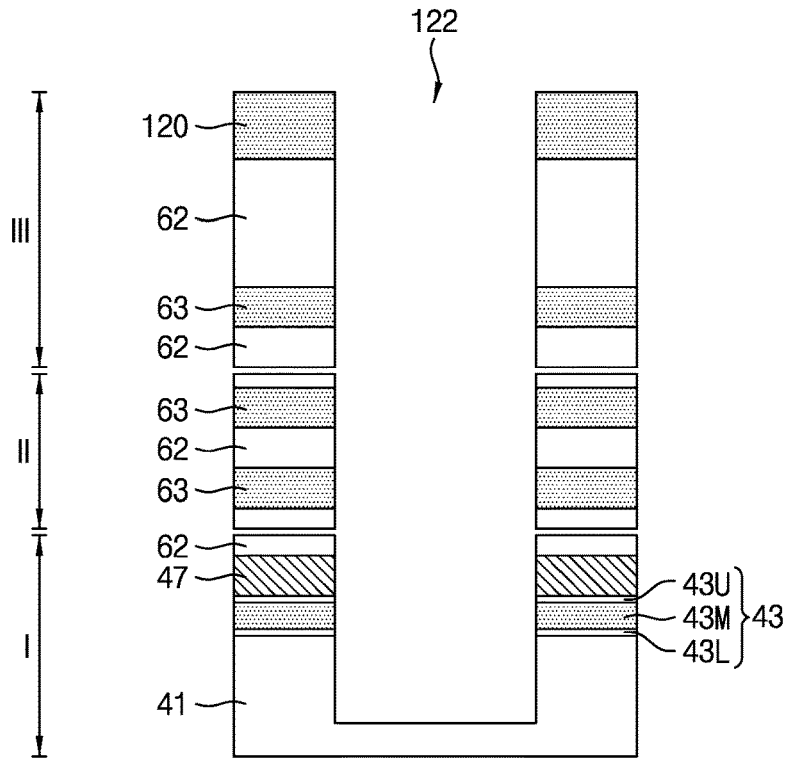

Referring to FIGS. 7 and 8, a first mask pattern 120 may be formed on the stack structure 60. Using the first mask pattern 120 as an etch mask, a plurality of channel holes 122, which extends into the horizontal wiring layer 40 while extending through the stack structure 60, may be formed. Each of the plurality of channel holes 122 may extend into the horizontal conductive layer 41 while extending through the stack structure 60, the support 47 and the horizontal mold layer 43. The plurality of insulating layers 62, the plurality of mold layers 63, the support 47 and the horizontal mold layer 43 may be exposed to side walls of the channel holes 122.

Figure 9:
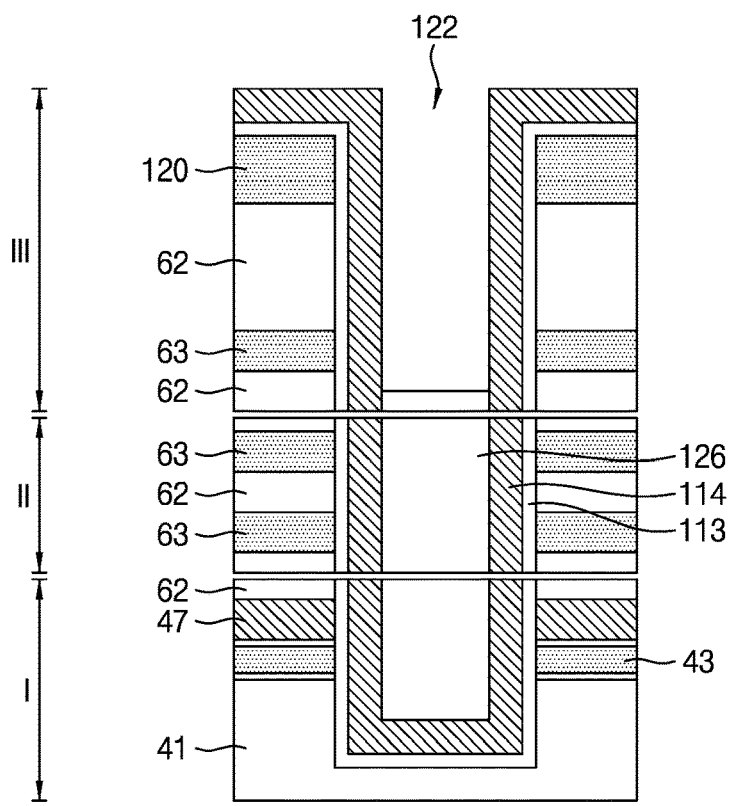

Referring to FIG. 9, a gate dielectric layer 113 may be formed on inner walls of the plurality of channel holes 122. A channel layer 114 may be formed on the gate dielectric layer 113. A sacrificial core layer 126 may be formed on the channel layer 114.

The gate dielectric layer 113 may extend on the first mask pattern 120 while covering bottoms of the plurality of channel holes 122 and the side walls of the plurality of channel holes 122. The gate dielectric layer 113 may include or may be a single layer and multiple layers. The gate dielectric layer 113 may include or may be formed of silicon oxide, silicon nitride, silicon oxynitride, silicon boron nitride (SiBN), silicon carbon nitride (SiCN), low-k dielectrics, high-k dielectrics, or a combination thereof. In an embodiment, the gate dielectric layer 113 may include or may be formed of silicon oxide.

The channel layer 114 may extend on the first mask pattern 120 while covering the bottoms and the side walls of the plurality of channel holes 122. The gate dielectric layer 113 may be preserved in a space (i.e., may remain in a space) between the channel layer 114 and the plurality of insulating layers 62, between the channel layer 114 and the plurality of mold layers 63, between the channel layer 114 and the support 47, between the channel layer 114 and the horizontal mold layer 43, and between the channel layer 114 and the horizontal conductive layer 41. The channel layer 114 may include or may be formed of a semiconductor material such as polysilicon, amorphous silicon, monocrystalline silicon, and a combination thereof. In an embodiment, the channel layer 114 may include or may be a polysilicon layer.

Formation of the sacrificial core layer 126 may include a thin film formation process and an etch-back process. An uppermost end of the sacrificial core layer 126 may be formed at a lower level than one of the plurality of mold layers 63 disposed at an uppermost end of the plurality of mold layers 63. Side surfaces of the channel layer 114 may be exposed to upper regions of the plurality of channel holes 122 (for example, at a higher level than the uppermost end of the sacrificial core layer 126). The sacrificial core layer 126 may include or may be formed of a material having etch selectivity with respect to the channel layer 114. The sacrificial core layer 126 may include or may be formed of silicon oxide, silicon nitride, silicon oxynitride, or a combination thereof. In an embodiment, the sacrificial core layer 126 may include or may be formed of silicon oxide.

Figure 10:
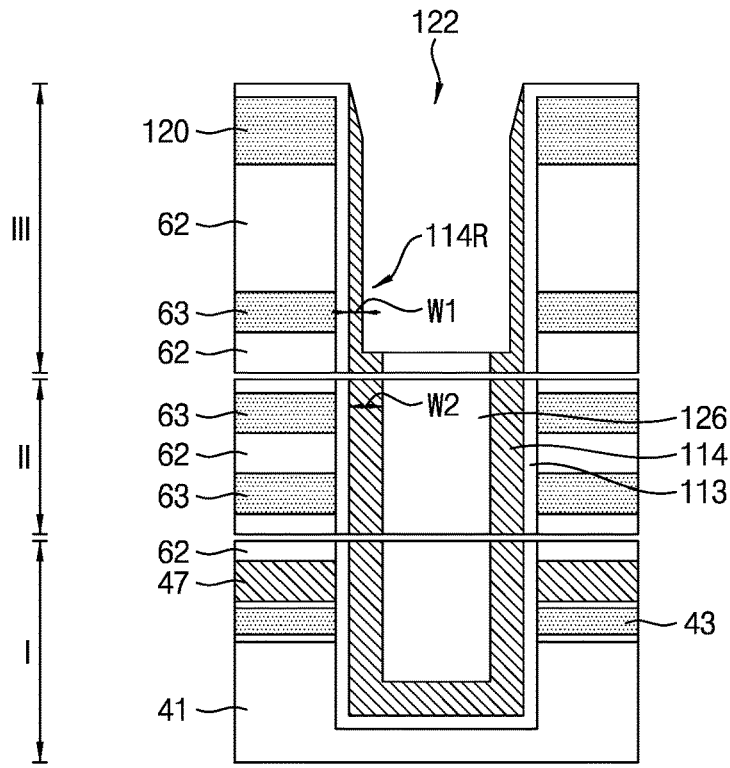

Referring to FIG. 10, an exposed portion of the channel layer 114 may be partially removed, thereby forming a recess region 114R. Formation of the recess region 114R through partial removal of the exposed portion of the channel layer 114 may include an anisotropic etching process, an isotropic etching process, or a combination thereof. The recess region 114R may be formed at a higher level than a top surface of the sacrificial core layer 126. In an embodiment, the recess region 114 and the sacrificial core layer 126 may vertically align (i.e., overlap) with each other. A lowermost end of the recess region 114R may be formed at a lower level than one of the plurality of mold layers 63 disposed at the uppermost end of the plurality of mold layers 63.

A portion of the channel layer 114 adjacent to one of the plurality of mold layers 63 disposed at the uppermost end of the plurality of mold layers 63 may have a first horizontal width W1. A portion of the channel layer 114 adjacent to one of the plurality of mold layers 63 disposed at the center of the stack structure 60 may have a second horizontal width W2. The first horizontal width W1 may be smaller than the second horizontal width W2.

Figure 11:
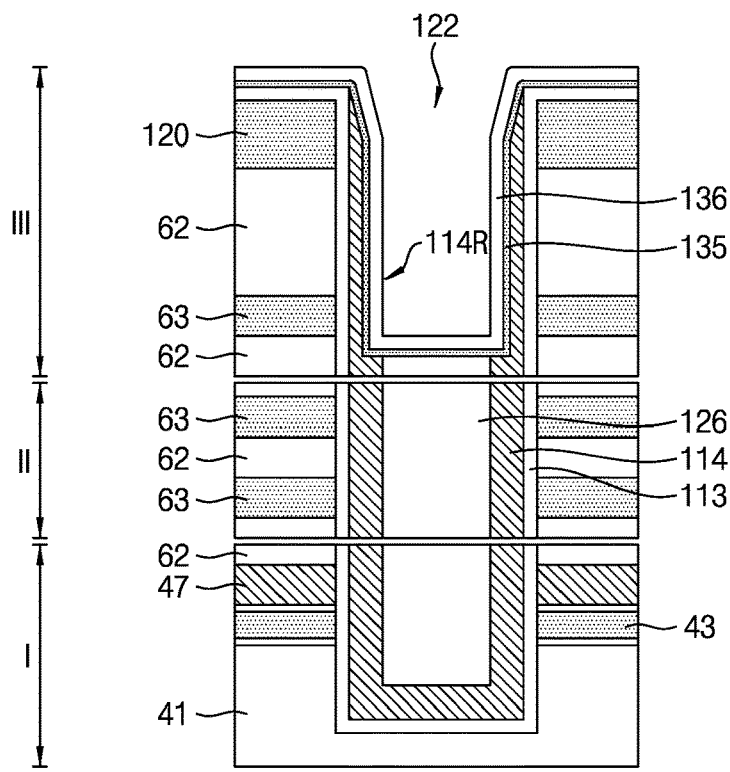

Referring to FIG. 11, a blocking mold layer 135 may be formed on inner walls of the channel hole 122. The blocking mold layer 135 may conformally cover a surface of the recess region 114R. The blocking mold layer 135 may contact the channel layer 114. In an embodiment, the blocking mold layer 135 may include or may be formed of a material layer having etch selectivity with respect to the channel layer 114. The blocking mold layer 135 may include a nitride layer such as a silicon nitride layer.

A spacer 136 may be formed on the blocking mold layer 135. The spacer 136 may include or may be formed of a material different from a material of the blocking mold layer 135. In an embodiment, the spacer 136 may include or may be formed of an oxide layer such as a silicon oxide layer.

Figure 12:
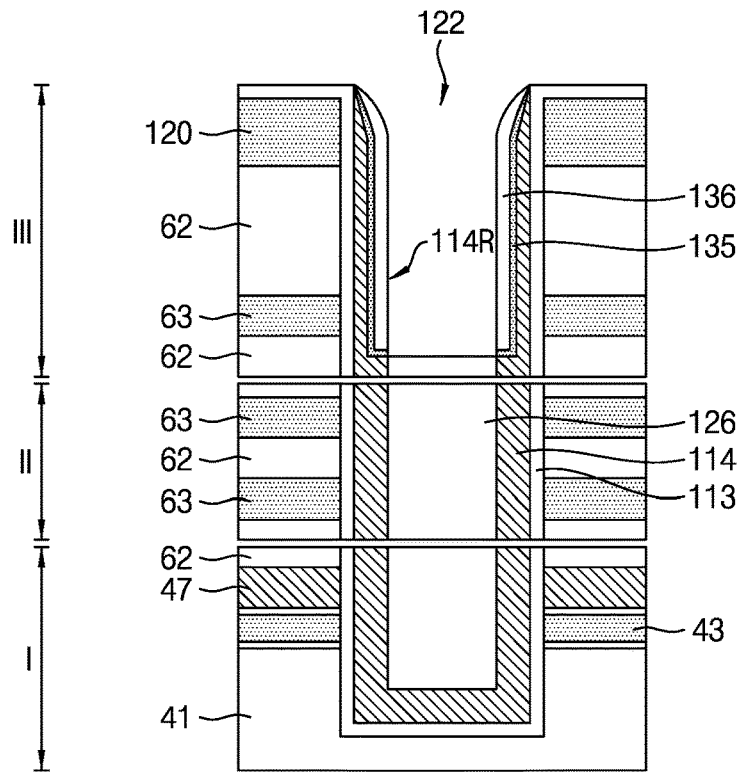

Referring to FIG. 12, the spacer 136 and the blocking mold layer 135 may be partially removed using an anisotropic etching process. The spacer 136 and the blocking mold layer 135 may be preserved (i.e., may remain) in the recess region 114R after the partial removing of the blocking mold layer 135. A top surface of the sacrificial core layer 126 may be exposed in the channel hole 122.

Figure 13:
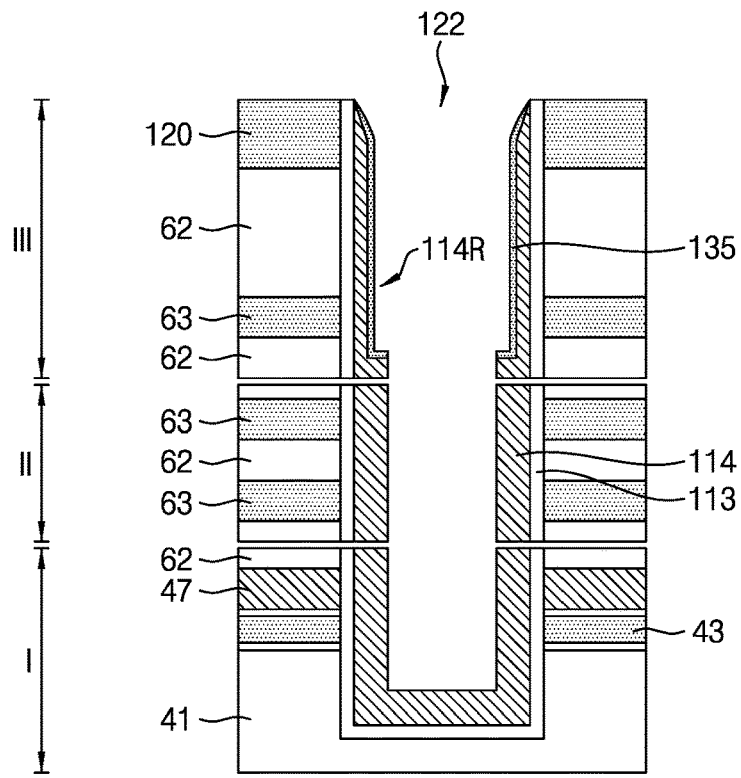

Referring to FIG. 13, the sacrificial core layer 126 and the spacer 136 may be removed, thereby exposing the channel layer 114 and the blocking mold layer 135 in the channel hole 122.

Figure 14:
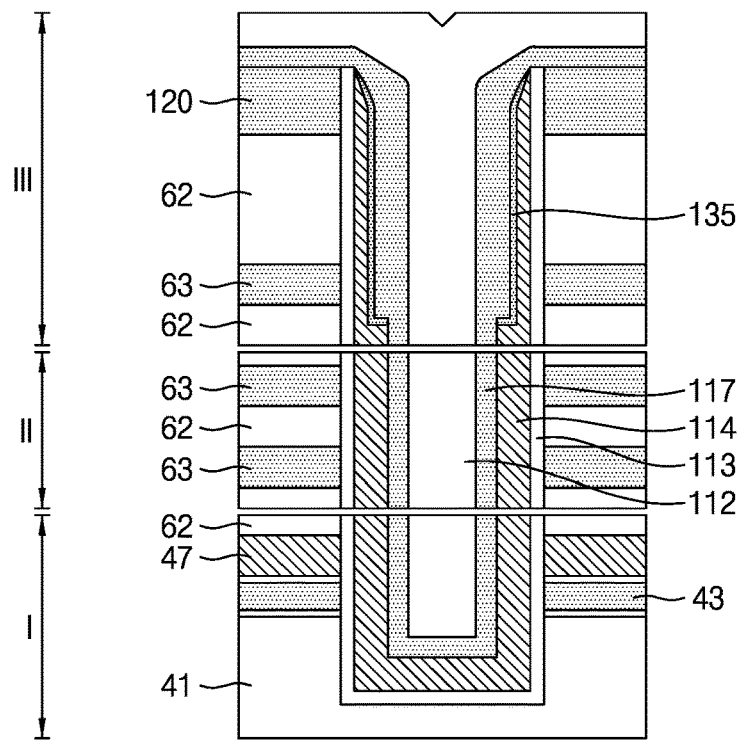

Referring to FIG. 14, a variable resistive layer 117 may be formed on the channel layer 114 and the blocking mold layer 135 in the channel hole 122. The variable resistive layer 117 may contact the channel layer 114. The blocking mold layer 135 may be preserved in a space (i.e., may remain in a space) between the channel layer 114 and the variable resistive layer 117. A core pattern 112 may be formed on the channel layer 114, to fill the channel hole 122.

The variable resistive layer 117 may include or may be formed of HfO, NiO, CuO, CoO, $Fe_2O_3$, $TiO_2$, $Ta_2O_5$, $Nb_2O_5$, $SrTiO_3$(STO), $SrZrO_3$, AlO, SiO, SiN, lanthanum strontium manganese oxide (LSMO), lanthanum calcium manganese oxide (LCMO), praseodymium calcium manganese oxide (PCMO), praseodymium lanthanum calcium manganese oxide (PLCMO), yttrium barium copper oxide (YBCO), bismuth strontium calcium copper oxide (BSCCO), $Bi:SrTiO_3$, $Cr:SrTiO_3$, HfSiO, AlSiO, WO, Mott, GeSbTe, C-doped GeSbTe, N-doped GeSbTe, SnSbTe, GeAsTe, GeSbSe, $(GeTe)(Sb_2Te_3)$, Zr60Al15Ni25, Fe—Co—B—Si—Nb, or a combination thereof. In an embodiment, the variable resistive layer 117 may include or may be formed of HfO or HfSiO. The core pattern 112 may include or may be formed of an insulating material such as silicon oxide, silicon nitride, silicon oxynitride, low-k dielectrics, high-k dielectrics, and a combination thereof. In an embodiment, the core pattern 112 may include or may be formed of an oxide layer such as a silicon oxide layer.

Figure 15:
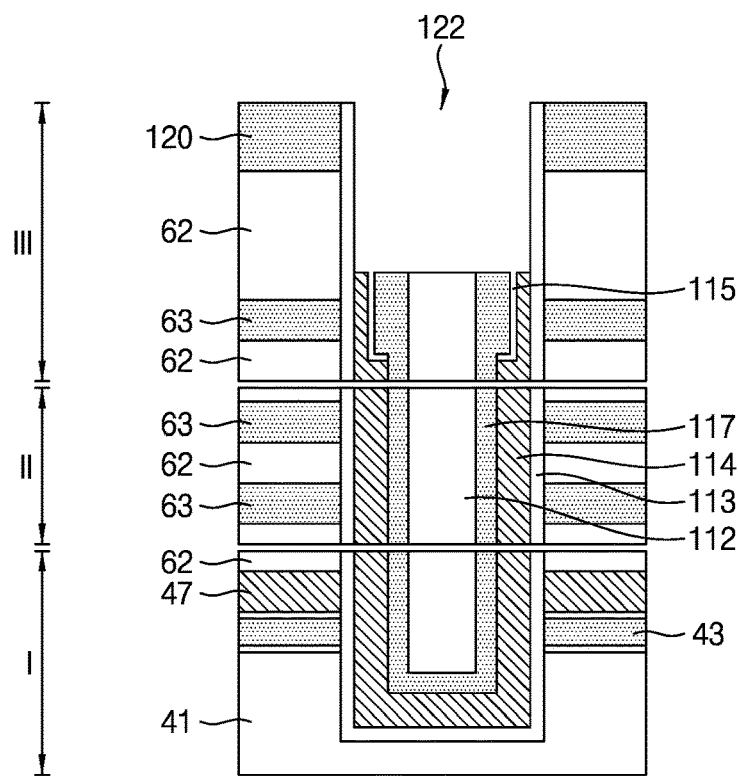

Referring to FIG. 15, top surfaces of the core pattern 112, the variable resistive layer 117 and the channel layer 114 may be recessed to a lower level than an uppermost end of the stack structure 60 using an etch-back process. In an embodiment, top surfaces of the core pattern 112, the variable resistive layer 117 and the channel layer 114 may be formed at a higher level than the uppermost end of the plurality of mold layers 63. The blocking mold layer 135 may be removed, thereby forming a blocking pattern 115. In an embodiment, the blocking pattern 115 may include or may be an empty space. The blocking pattern 115 may be formed between the variable resistive layer 117 and the channel layer 114. The blocking pattern 115 may be formed adjacent to one of the plurality mold layers 63 disposed at the uppermost end of the plurality of mold layers 63.

Figure 16:
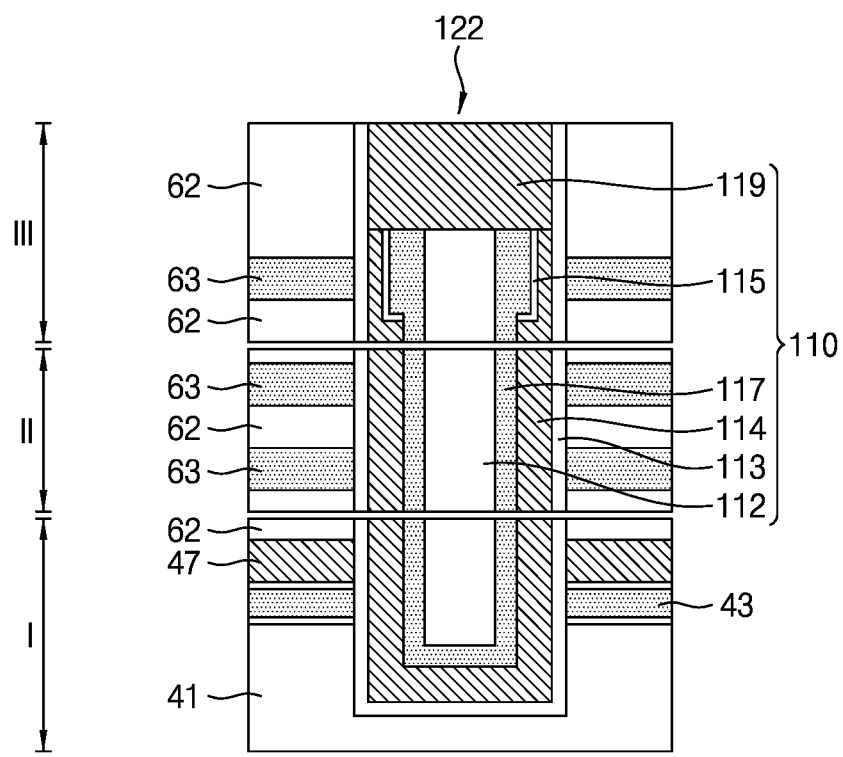
Figure 17:
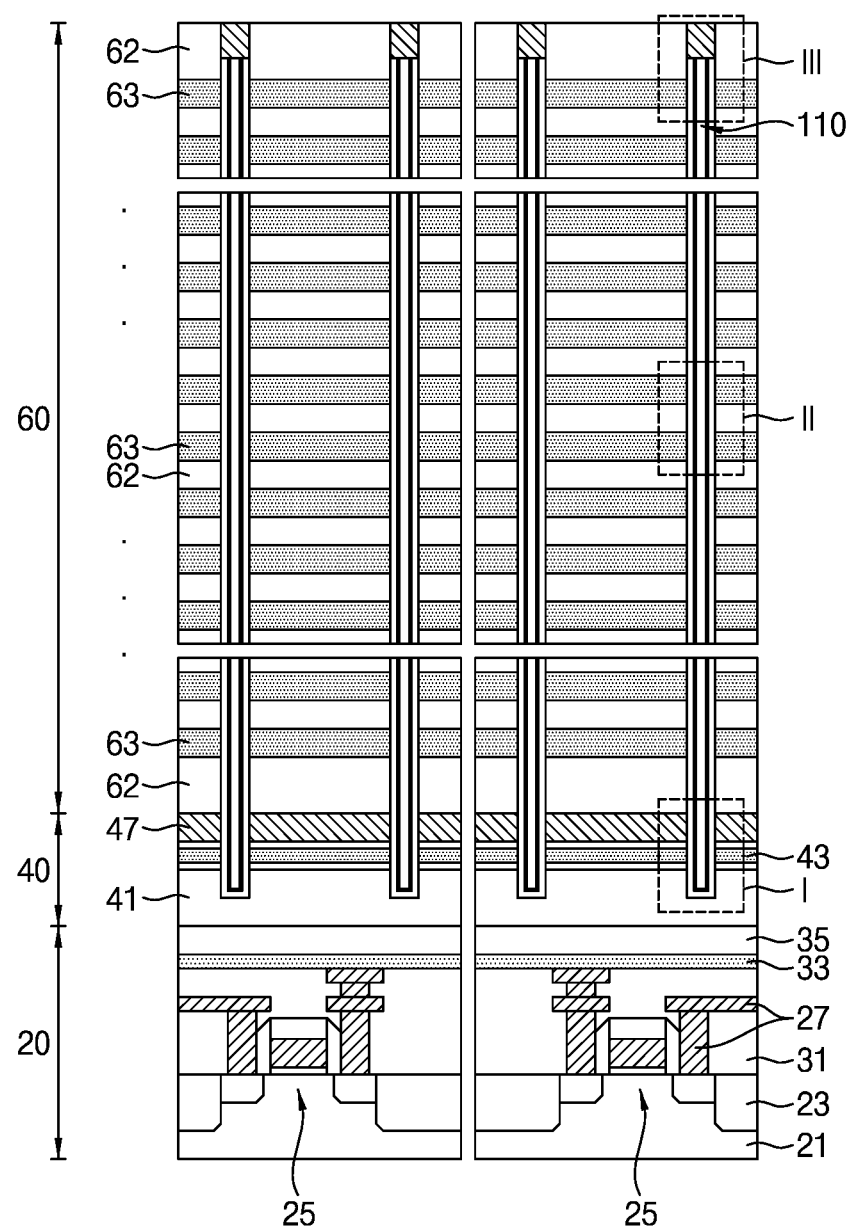

FIG. 16 may be a partial view showing portions I, II and III of FIG. 17.

Referring to FIGS. 16 and 17, a pad 119 may formed on the core pattern 112, the variable resistive layer 117, the blocking pattern 115 and the channel layer 114. The first mask pattern 120 may be removed, thereby exposing top surfaces of the pad 119 and the stack structure 60. The pad 119 may be preserved in the channel hole 122. In an embodiment, an uppermost end of the plurality of insulating layers 62 and a top surface of the pad 119 may be substantially coplanar. The core pattern 112, the gate dielectric layer 113, the channel layer 114, the blocking pattern 115, the variable resistive layer 117, and the pad 119 may constitute a pillar structure 110.

Figure 18:
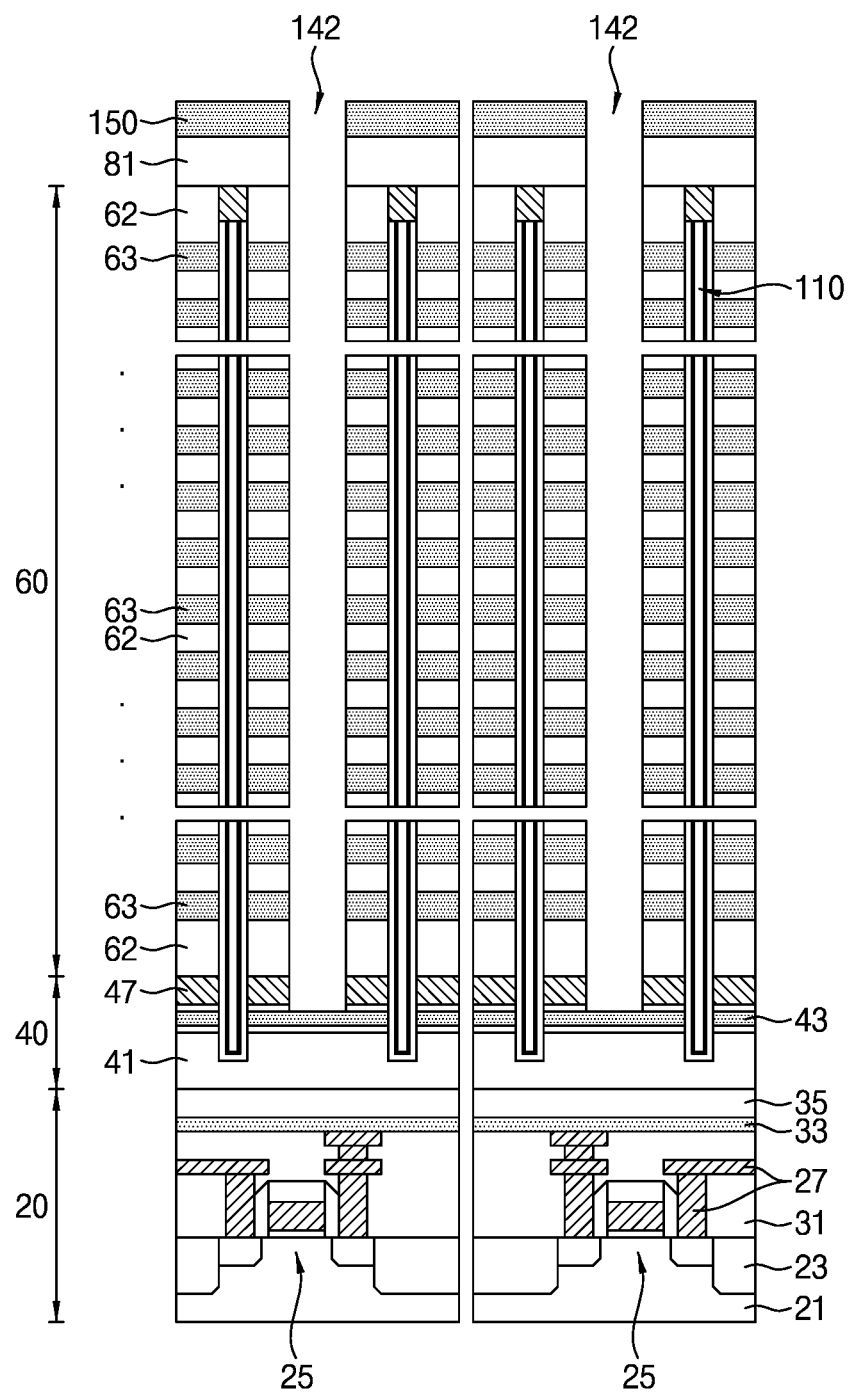

Referring to FIG. 18, an upper insulating layer 81 may be formed on the stack structure 60 and the plurality of pillar structures 110. The upper insulating layer 81 may include or may be formed of an insulating material such as silicon oxide, silicon nitride, silicon oxynitride, low-k dielectrics, high-k dielectrics, or a combination thereof. In an embodiment, the upper insulating layer 81 may include or may be an oxide layer such as a silicon oxide layer.

A second mask pattern 150 may be formed on the upper insulating layer 81. Using the second mask pattern 150 as an etch mask, a plurality of separation trenches 142 may be formed to extend into the horizontal mold layer 43 while extending through the upper insulating layer 81, the stack structure 60 and the support 47. The plurality of insulating layers 62 and the plurality of mold layers 63 may be exposed to side walls of the plurality of separation trenches 142.

Figure 19:
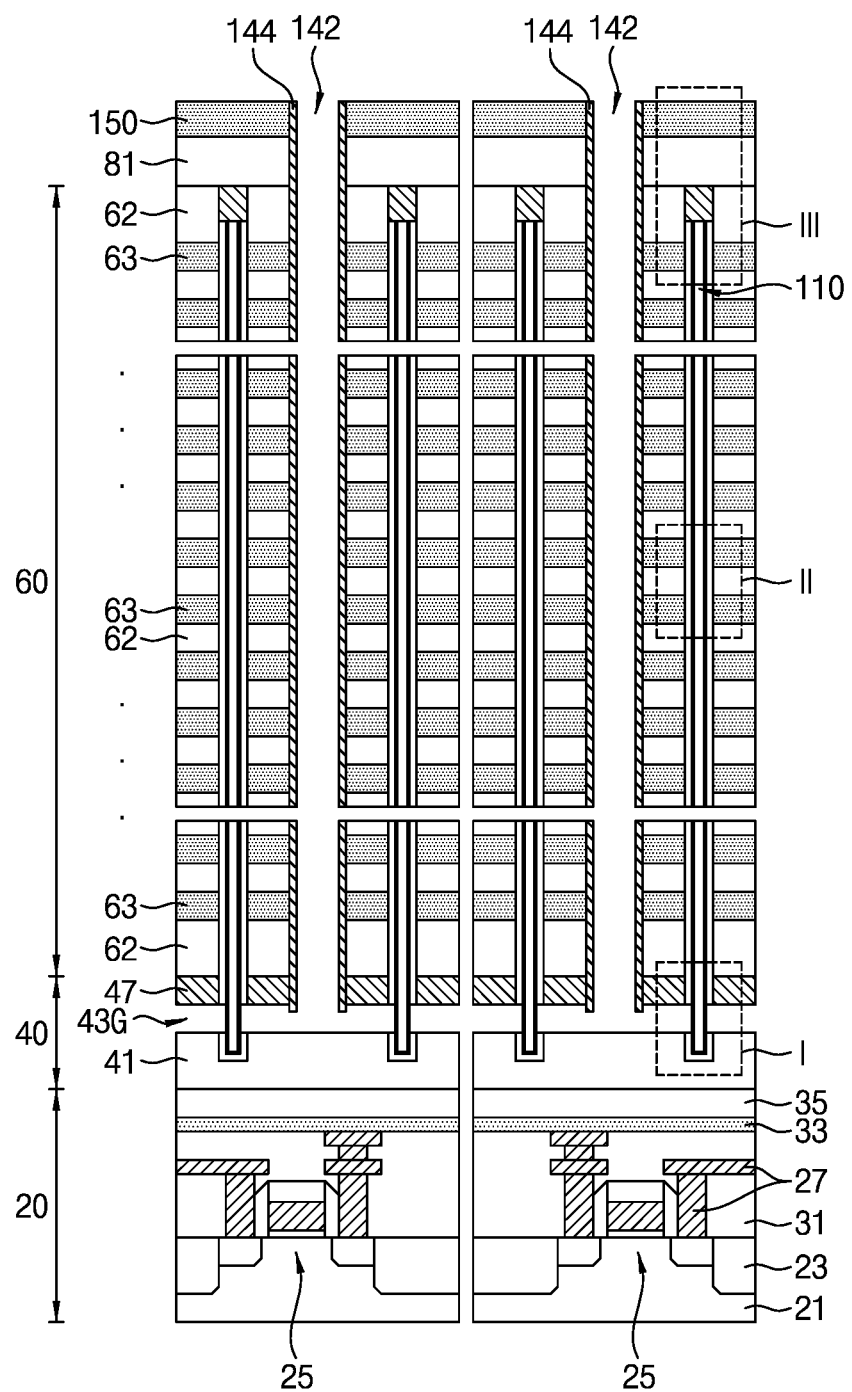
Figure 20:
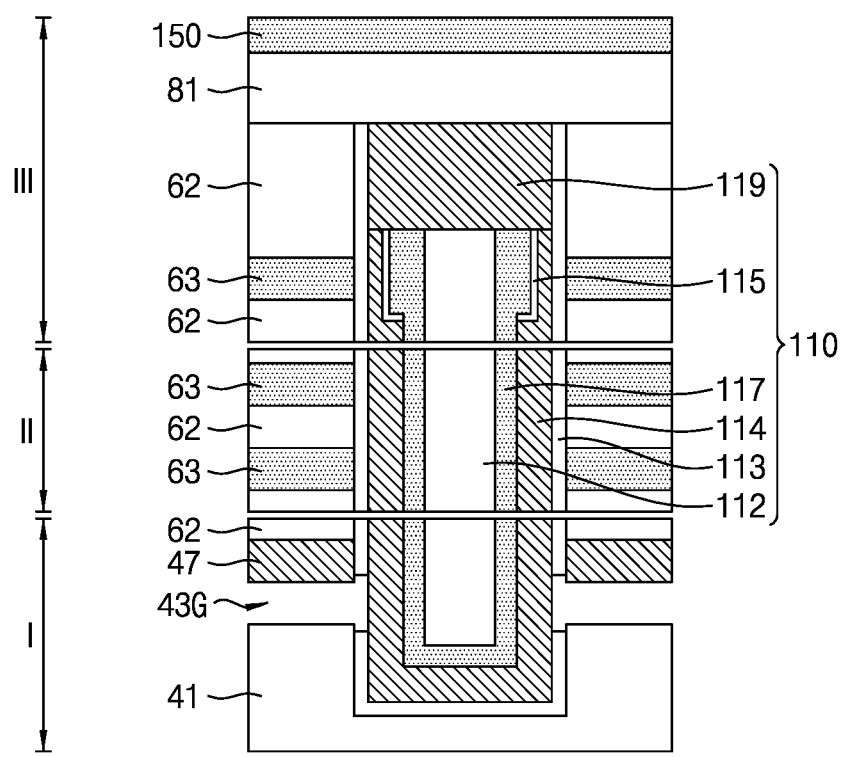

FIG. 20 may be partial views showing portions I, II and III of FIG. 19.

Referring to FIGS. 19 and 20, a sacrificial spacer 144 may be formed on the side walls of the plurality of separation trenches 142. Formation of the sacrificial spacer 144 may include a thin film formation process and an anisotropic etching process. The sacrificial spacer 144 may include or may be formed of a material having etch selectivity with respect to the horizontal mold layer 43. In an embodiment, the sacrificial spacer 144 may include or may be formed of polysilicon.

The horizontal mold layer 43 may be removed, thereby forming a first gap region 43G between the horizontal conductive layer 41 and the support 47. The first gap region 43G may extend through side surfaces of the gate dielectric layer 113. The side surfaces of the channel layer 114 may be exposed in the first gap region 43G.

Figure 21:
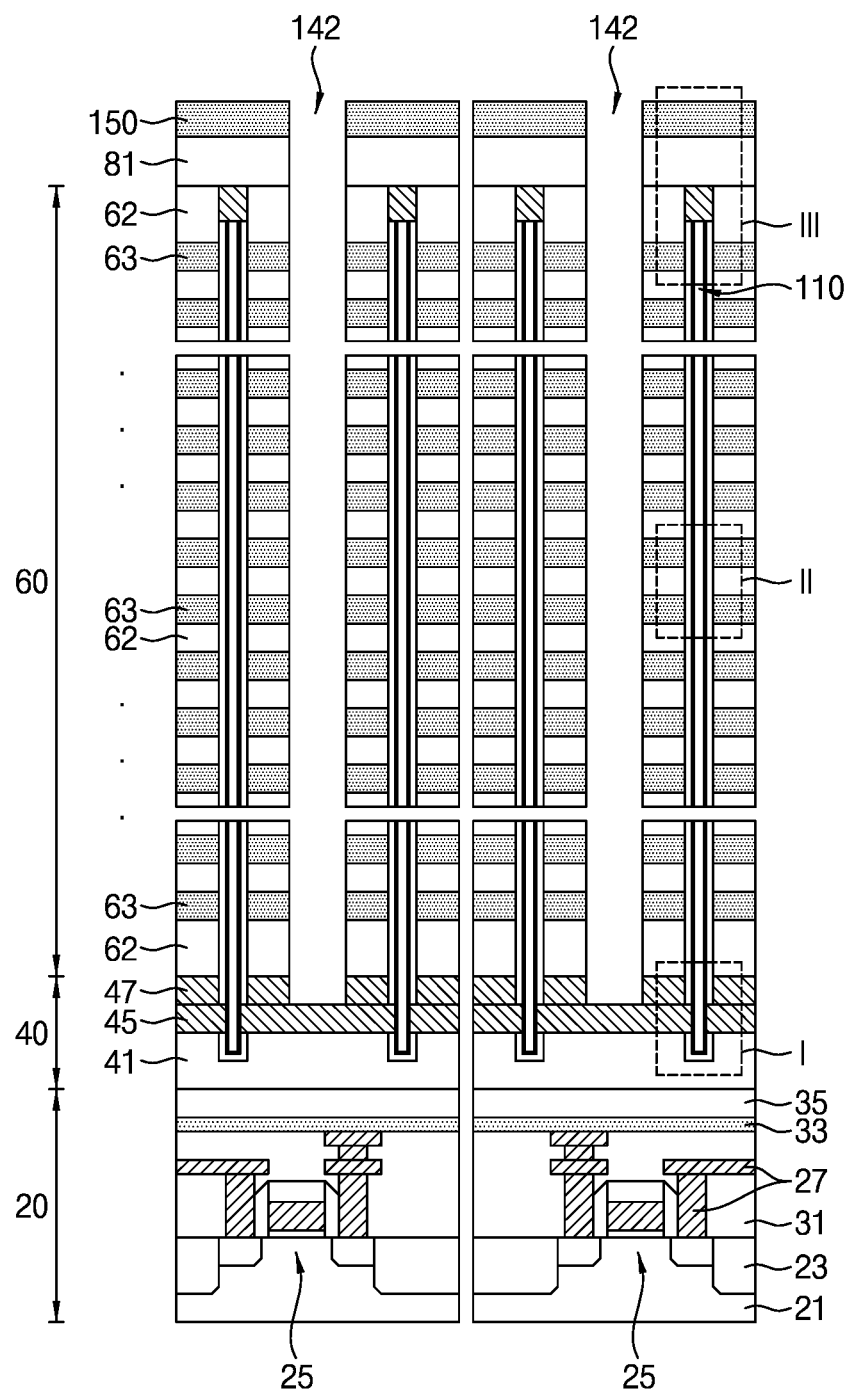
Figure 22:
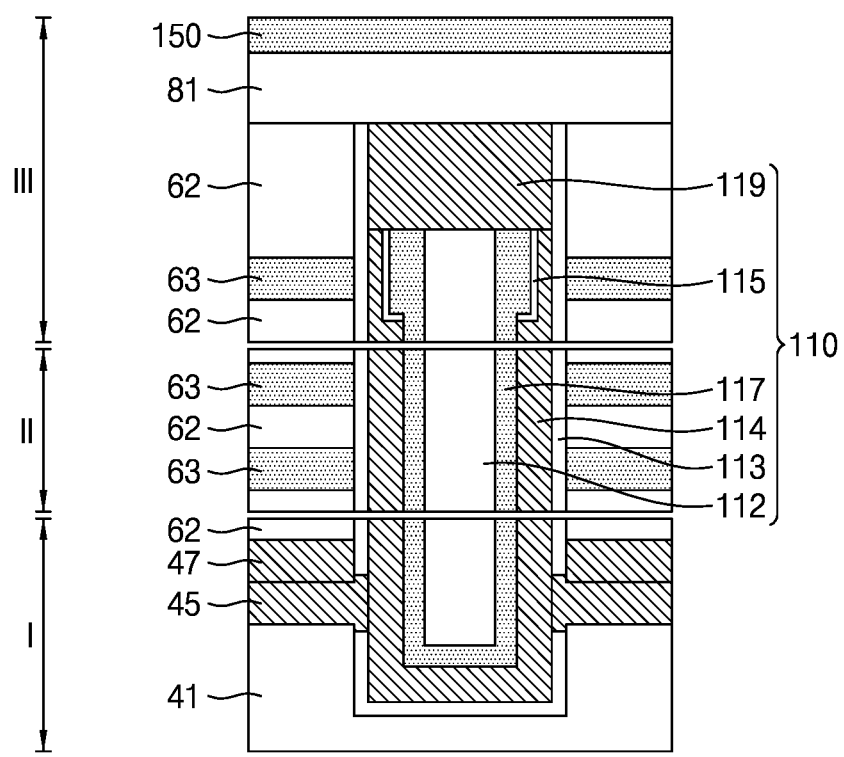

FIG. 22 may be a partial view showing portions I, II and III of FIG. 21.

Referring to FIGS. 21 and 22, a sealing conductive layer 45 may be formed in the first gap region 43G. The sealing conductive layer 45 may contact the horizontal conductive layer 41 and the channel layer 114. The sealing conductive layer 45 may include or may be formed of a conductive material such as metal, metal nitride, metal oxide, metal silicide, conductive carbon, polysilicon, amorphous silicon, monocrystalline silicon, and a combination thereof. In an embodiment, the sealing conductive layer 45 may include or may be a doped polysilicon layer. The sacrificial spacer 144 may be removed, thereby exposing the plurality of insulating layers 62 and the plurality of mold layers 63 to the side walls of the plurality of separation trenches 142.

Figure 23:
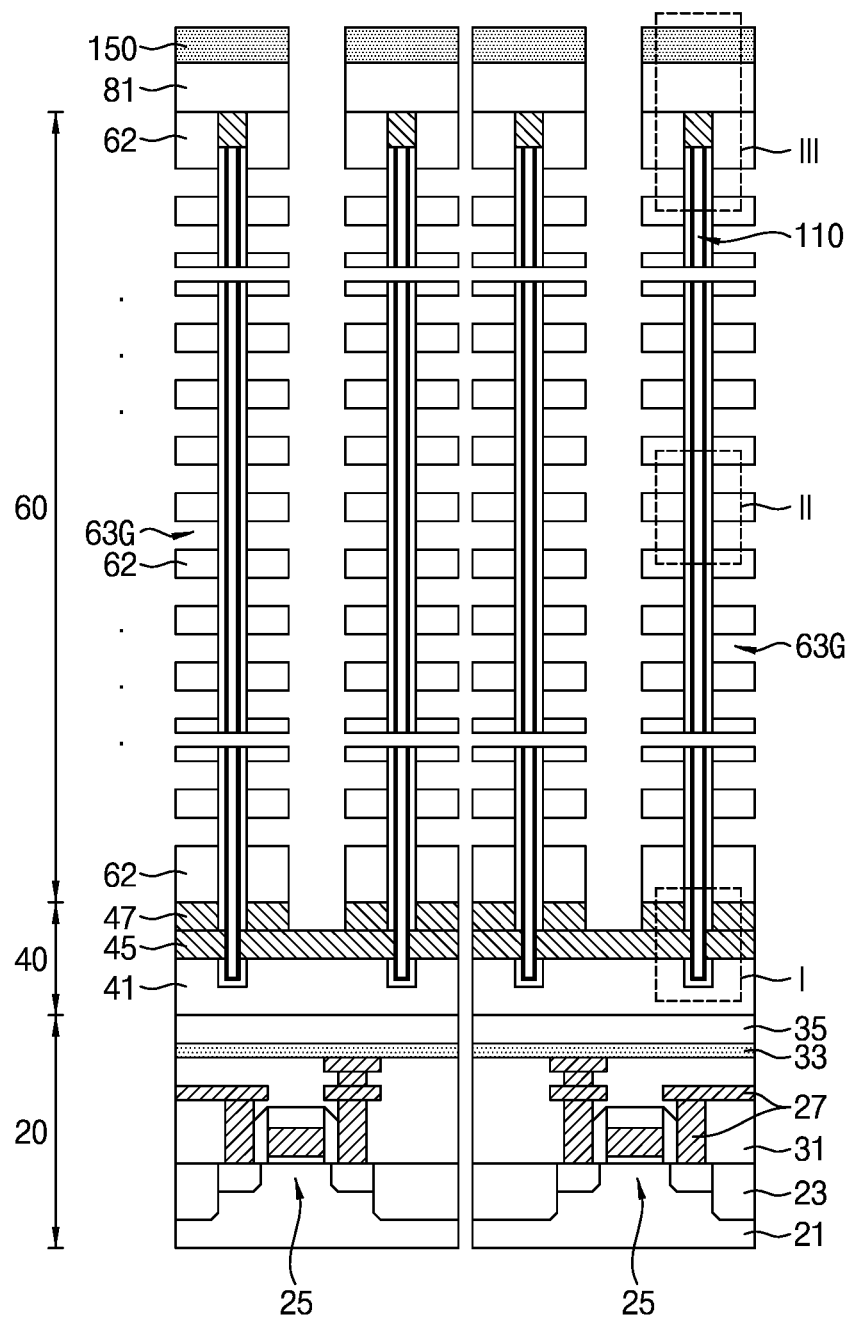
Figure 24:
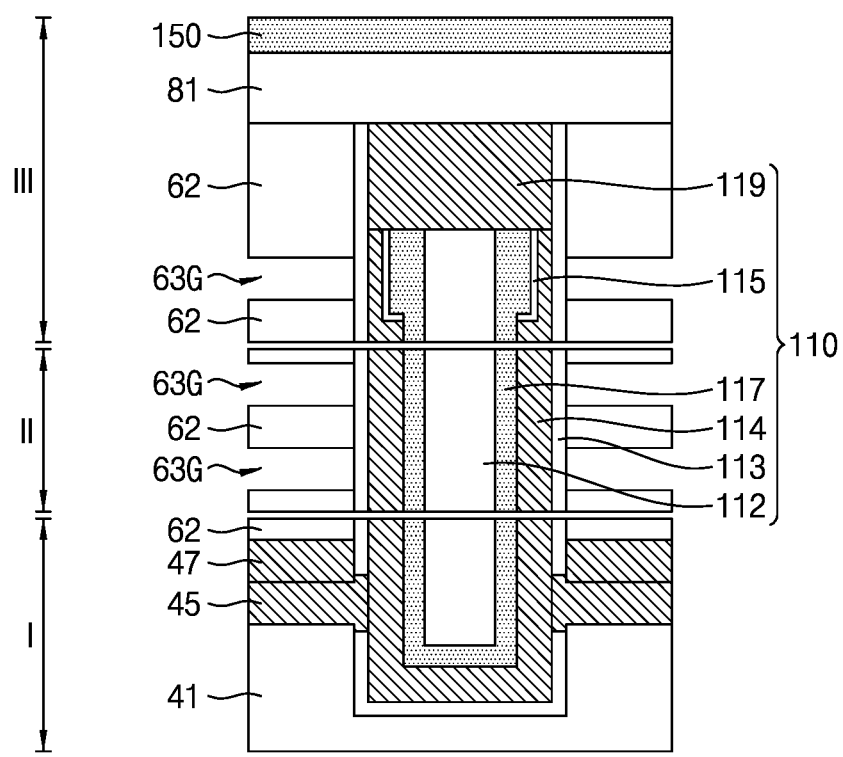

FIG. 24 may be a partial view showing portions I, II and III of FIG. 23.

Referring to FIGS. 23 and 24, the plurality of mold layers 63 may be removed, thereby forming a plurality of second gap regions 63G among the plurality of insulating layers 62. The plurality of second gap regions 63G may communicate with the plurality of separation trenches 142. Side surfaces of the plurality of pillar structures 110 may be exposed in the plurality of second gap regions 63G. The gate dielectric layer 113 may be exposed in the plurality of second gap regions 63G.

Figure 25:
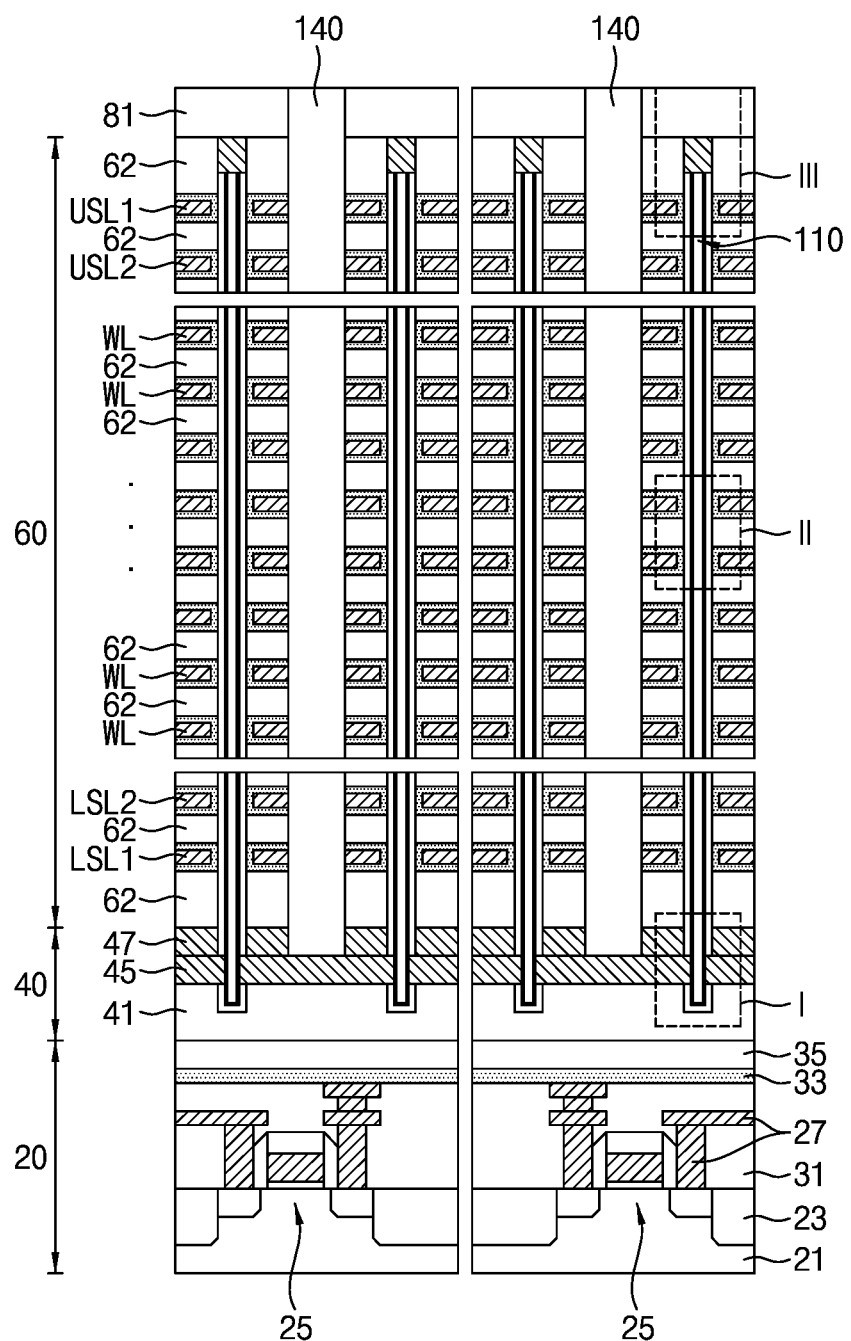
Figure 26:
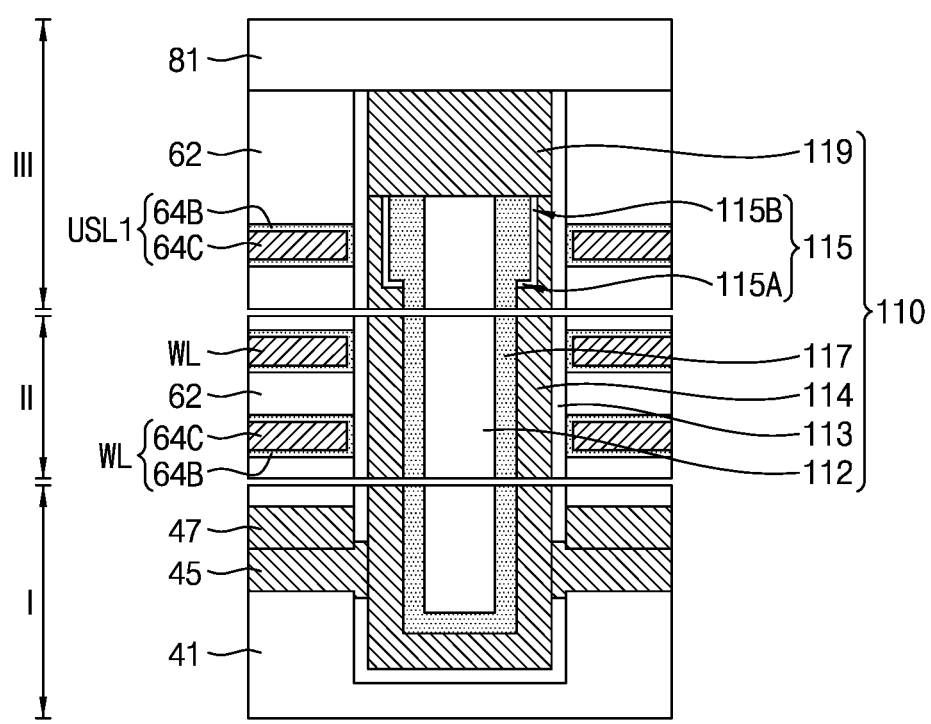

FIG. 26 may be a partial view showing portions I, II and III of FIG. 25.

Referring to FIGS. 25 and 26, a plurality of electrode layers LSL1, LSL2, WL, USL1 and USL2 may be formed in the plurality of second gap regions 63G. Formation of the plurality of electrode layers LSL1, LSL2, WL, USL1 and USL2 may include a plurality of thin film formation processes and an etch-back process. Each of the plurality of electrode layers LSL1, LSL2, WL, USL1 and USL2 may be a single layer. In an embodiment, each of the plurality of electrode layers LSL1, LSL2, WL, USL1 and USL2 may be formed of multiple layers. Each of the plurality of electrode layers LSL1, LSL2, WL, USL1 and USL2 may include or may be formed of a conductive material such as metal, metal nitride, metal oxide, metal silicide, conductive carbon, polysilicon, amorphous silicon, monocrystalline silicon, and a combination thereof.

In an embodiment, each of the plurality of electrode layers LSL1, LSL2, WL, USL1 and USL2 may include a conductive layer 64C and a barrier layer 64B. The barrier layer 64B may include or may be formed of Ti, TiN, Ta, TaN, or a combination thereof. The conductive layer 64C may include or may be formed of W, WN, Ru, Ni, Co, Al, AlN, Cu, Sn, Pt, Ag, Au, Zn, Ti, TiN, Ta, TaN, or a combination thereof.

A plurality of separation insulating patterns 140 may be formed in the plurality of separation trenches 142. Each of the plurality of separation insulating patterns 140 may be formed of a single layer. In an embodiment, each of the plurality of separation insulating patterns 140 may be formed of multiple layers. The plurality of separation insulating patterns 140 may include or may be formed of an insulating material such as silicon oxide, silicon nitride, silicon oxynitride, low-k dielectrics, high-k dielectrics, and a combination thereof. The second mask pattern 150 may be removed, thereby exposing top surfaces of the upper insulating layer 81 and the plurality of separation insulating patterns 140 on the same plane.

Referring to FIGS. 1 and 2, a plurality of bit plugs 83 may be formed to contact the pad 119 while extending through the upper insulating layer 81. A plurality of bit lines 85 may be formed on the upper insulating layer 81, to contact the plurality of bit plugs 83. Each of the plurality of bit plugs 83 and the plurality of bit lines 85 may include a single layer or multiple layers. Each of the plurality of bit plugs 83 and the plurality of bit lines 85 may include or may be formed of a conductive material such as metal, metal nitride, metal oxide, metal silicide, conductive carbon, polysilicon, amorphous silicon, monocrystalline silicon, and a combination thereof.

Figure 27:
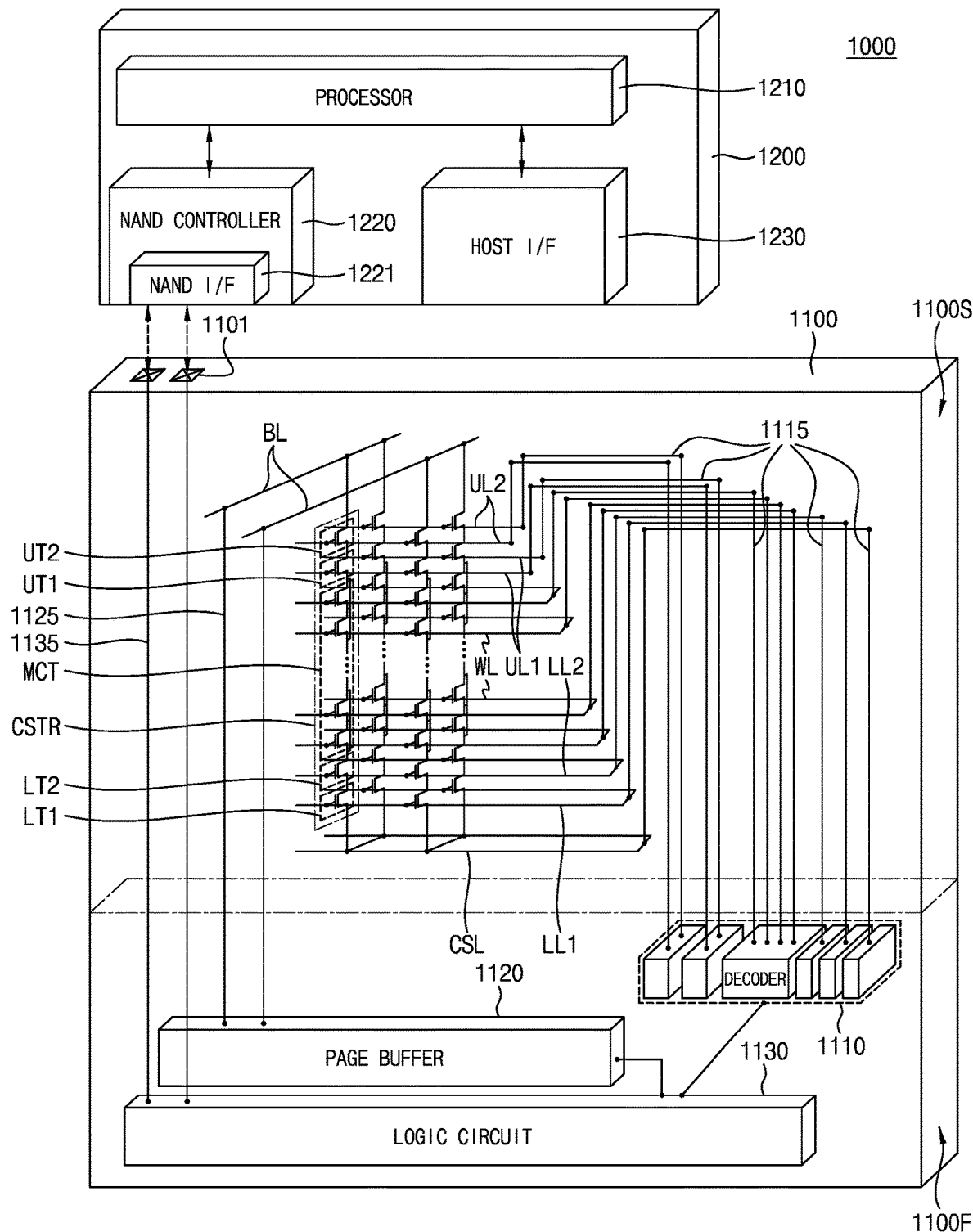
FIG. 27 is a view schematically showing an electronic system including semiconductor devices according to exemplary embodiments of the disclosure.
Figure 28:
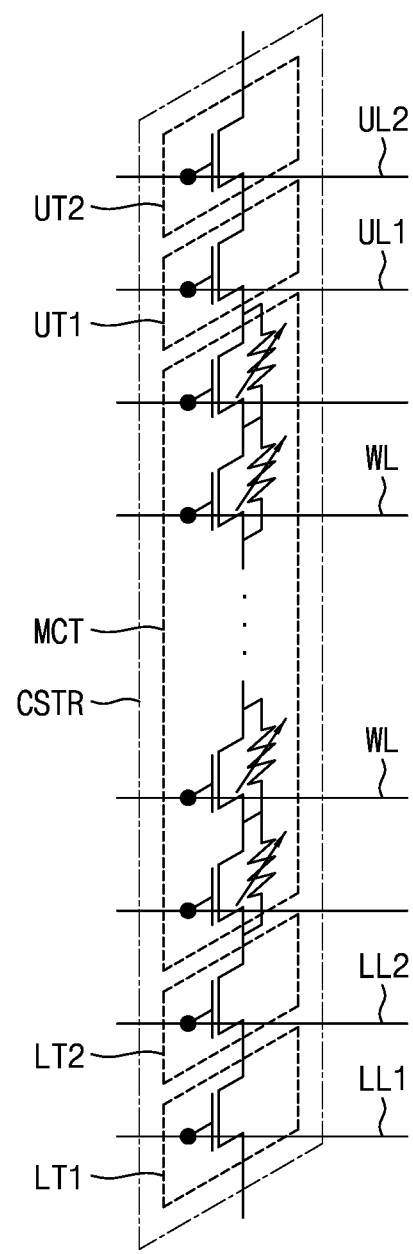
FIG. 28 is a partial view showing a portion of FIG. 27.

FIG. 27 is a view schematically showing an electronic system including semiconductor devices according to exemplary embodiments of the disclosure. FIG. 28 is a partial view showing a portion CSTR of FIG. 27.

Referring to FIGS. 27 and 28, an electronic system 1000 according to exemplary embodiments of the disclosure may include a semiconductor device 1100, and a controller 1200 electrically connected to the semiconductor device 1100. The electronic system 1000 may be a storage device including one semiconductor device 1100 or a plurality of semiconductor devices 1100, or an electronic device including a storage device. For example, the electronic system 1000 may be a solid state drive (SSD) device, a universal serial bus (USB) drive, a computing system, a medical device or a communication device which includes one semiconductor device 1100 or a plurality of semiconductor devices 1100. As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

The semiconductor device 1100 may include a first structure 1100F, and a second structure 1100S on the first structure 1100F. In exemplary embodiments, the first structure 1100F may be disposed at one side of the second structure 1100S. The first structure 1100F may be a peripheral circuit structure including a decoder circuit 1110, a page buffer 1120 and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

The semiconductor device 1100 may be a non-volatile memory device, and, for example, may include a semiconductor device described with reference to FIGS. 1 to 26. In an embodiment, the bit line BL may correspond to the plurality of bit lines ("85" in FIG. 2). The common source line CSL may correspond to the horizontal conductive layer ("41" in FIG. 2). The word lines WL may correspond to the plurality of word lines ("WL" in FIG. 2). The first and second gate upper lines UL1 and UL2 may correspond to the plurality of upper selection lines ("USL1" and "USL2" in FIG. 2). The first and second gate lower lines LL1 and LL2 may correspond to the plurality of lower selection lines ("LSL1" and "LSL2" in FIG. 2).

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be diversely varied in accordance with embodiments.

In exemplary embodiments, the upper transistors UT1 and UT2 may include a string selection transistor, whereas the lower transistors LT1 and LT2 may include a ground selection transistor. The first and second gate lower lines LL1 and LL2 may be gate electrodes of the lower transistors LT1 and LT2, respectively. The word lines WL may be gate electrodes of the memory cell transistors MCT, respectively. The first and second gate upper lines UL1 and UL2 may be gate electrodes of the upper transistors UT1 and UT2, respectively.

In exemplary embodiments, the lower transistors LT1 and LT2 may include at least one ground selection transistor. The upper transistors UT1 and UT2 may include at least one string selection transistor.

The common source line CSL, the first and second gate lower lines LL1 and LL2, the word lines WL, and the first and second gate upper lines UL1 and UL2 may be electrically connected to the decoder circuit 1110 via first connecting lines 1115 extending from an interior of the first structure 1100F to the second structure 1100S. The bit lines BL may be electrically connected to the page buffer 1120 via second connecting lines 1125 extending from the interior of the first structure 1100F to the second structure 1100S.

In the first structure 1100F, the decoder circuit 1110 and the page buffer 1120 may perform a control operation for a selection memory cell transistor of at least one of the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 via an input/output connecting line 1135 extending from the interior of the first structure 1100F to the second structure 1100S.

The controller 1200 may include a processor 1210, a NAND controller 1220, and a host interface 1230. In accordance with embodiments, the electronic system 1000 may include a plurality of semiconductor devices 1100. In this case, the controller 1200 may control the plurality of semiconductor devices 1100.

The processor 1210 may control overall operations of the electronic system 1000 including the controller 1200. The processor 1210 may operate in accordance with predetermined firmware, and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, data to be read out from the memory cell transistors MCT of the semiconductor device 1100, etc. may be transmitted through the NAND interface 1221. The host interface 1230 may provide a communication function between the electronic system 1000 and an external host. Upon receiving a control command from an external host via the host interface 1230, the processor 1210 may control the semiconductor device 1100 in response to the control command.

In accordance with exemplary embodiments of the disclosure, a blocking pattern adjacent to one or a plurality of selection lines is provided. The blocking pattern is disposed between a variable resistive layer and a channel layer. The blocking pattern may function to block leakage current flowing through an interface between the variable resistive layer and the channel layer. Semiconductor devices having excellent electrical characteristics, an electronic system including the same, and a method of forming the same may be provided.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor device comprising:
   a horizontal wiring layer on a substrate;
   a stack structure disposed on the horizontal wiring layer, the stack structure comprising a plurality of insulating layers and a plurality of electrode layers alternately stacked on each other; and
   a pillar structure extending into the horizontal wiring layer and extending through the stack structure,
   wherein the plurality of electrode layers comprise
      one or a plurality of selection lines adjacent to an uppermost end of the stack structure, and
      a plurality of word lines surrounding the stack structure below the one or plurality of selection lines,
   wherein the pillar structure comprises
      a variable resistive layer,
      a channel layer between the variable resistive layer and the stack structure,
      a gate dielectric layer between the channel layer and the stack structure, and
      a blocking pattern disposed between the variable resistive layer and the channel layer and being adjacent to a first selection line among the one or plurality of selection lines, wherein the channel layer is disposed between the first selection line and the blocking pattern.

2. The semiconductor device according to claim 1, wherein the blocking pattern comprises an air gap, a material having greater resistivity than the channel layer, a material having greater resistivity than the variable resistive layer, or a combination thereof.

3. The semiconductor device according to claim 1, wherein:
   a lowermost end of the blocking pattern is disposed below a bottom surface of the first selection line among the one or plurality of selection lines; and
   an uppermost end of the blocking pattern extends to a higher level than a top surface of the first selection line among the one or plurality of selection lines.

4. The semiconductor device according to claim 1, wherein the blocking pattern comprises an L shape, a bar shape, or a combination thereof.

5. The semiconductor device according to claim 1, wherein the blocking pattern comprises:
   a first portion extending in a first horizontal direction and having a horizontal width greater than a vertical height; and
   a second portion being connected to an end of the first portion, the second portion vertically extending from the end of the first portion and having a vertical height greater than a horizontal width.

6. The semiconductor device according to claim 1, wherein the channel layer includes:
   a first portion with a first width, the first portion of the channel layer being positioned at a horizontal line passing through the first selection line among the one or plurality of selection lines; and
   a second portion with a second width, the second portion of the channel layer being positioned at a horizontal line passing through a first word line among the plurality of word lines, and
   wherein the first width is smaller than the second width.

7. The semiconductor device according to claim 1, wherein a portion of the variable resistive layer is positioned at a horizontal line passing through a first word line among the plurality of word lines, and the portion of the variable resistive layer contacts the channel layer.

8. The semiconductor device according to claim 1, wherein the variable resistive layer comprises HfO, NiO, CuO, CoO, $Fe_2O_3$, $TiO_2$, $Ta_2O_5$, $Nb_2O_5$, $SrTiO_3$(STO), $SrZrO_3$, AlO, SiO, SiN, lanthanum strontium manganese oxide (LSMO), lanthanum calcium manganese oxide (LCMO), praseodymium calcium manganese oxide (PCMO), praseodymium lanthanum calcium manganese oxide (PLCMO), yttrium barium copper oxide (YBCO), bismuth strontium calcium copper oxide (BSCCO), Bi:$SrTiO_3$, Cr:$SrTiO_3$, HfSiO, AlSiO, WO, Mott, GeSbTe, C-doped GeSbTe, N-doped GeSbTe, SnSbTe, GeAsTe, GeSbSe, (GeTe)($Sb_2Te_3$), Zr60Al15Ni25, Fe—Co—B—Si—Nb, or a combination thereof.

9. The semiconductor device according to claim 1, wherein:
   the pillar structure further comprises
      a core pattern, and
      a pad on the core pattern, the variable resistive layer, the blocking pattern, and the channel layer; and
   the variable resistive layer surrounds an outside of the core pattern.

10. The semiconductor device according to claim 1, wherein:
    the horizontal wiring layer comprises
       a horizontal conductive layer,
       a sealing conductive layer on the horizontal conductive layer, and
       a support on the sealing conductive layer; and
    the sealing conductive layer contacts the channel layer and extending through a side surface of the gate dielectric layer.

11. The semiconductor device according to claim 10, wherein the pillar structure extends into the horizontal conductive layer and extending through the support and the sealing conductive layer.

12. A semiconductor device comprising:
    a stack structure comprising a plurality of insulating layers and a plurality of electrode layers alternately stacked on each other; and
    a pillar structure disposed on a side surface of the stack structure,
    wherein the pillar structure comprises
       a variable resistive layer,
       a channel layer between the variable resistive layer and the stack structure,
       a gate dielectric layer between the channel layer and the stack structure, and
       a blocking pattern disposed between the variable resistive layer and the channel layer and being adjacent to an uppermost electrode layer of the plurality of electrode layers.

13. The semiconductor device according to claim 12, wherein the blocking pattern comprises an air gap, a material having greater resistivity than the channel layer, a material having greater resistivity than the variable resistive layer, or a combination thereof.

14. The semiconductor device according to claim 12, wherein:
a lowermost end of the blocking pattern is disposed below than a bottom surface of the uppermost electrode layer of the plurality of electrode layers; and
an uppermost end of the blocking pattern is disposed higher than a top surface of the uppermost electrode of the plurality of electrode layers.

15. The semiconductor device according to claim 12, wherein the blocking pattern comprises an L shape, a bar shape, or a combination thereof.

16. The semiconductor device according to claim 12, wherein the blocking pattern comprises:
a first portion extending in a first horizontal direction and having a horizontal width greater than a vertical height; and
a second portion being connected to an end of the first portion, the second portion vertically extending from the end of the first portion and having a vertical height greater than a horizontal width.

17. The semiconductor device according to claim 12, wherein the channel layer includes:
a first portion with a first width, the first portion of the channel layer being positioned at a horizontal line passing through the uppermost electrode layer of the plurality of electrode layers;
a second portion with a second width, the second portion of the channel layer being positioned at a horizontal line passing through a first electrode layer of the plurality of electrode layers adjacent to a center of the stack structure; and
wherein the first width is smaller than the second width.

18. An electronic system comprising:
a semiconductor device; and
a controller disposed adjacent to the semiconductor device and being electrically connected to the semiconductor device,
wherein the semiconductor device comprises:
a horizontal wiring layer on a substrate,
a stack structure disposed on the horizontal wiring layer, the stack structure comprising a plurality of insulating layers and a plurality of electrode layers alternately stacked on each other, and
a pillar structure extending into the horizontal wiring layer and extending through the stack structure,
wherein the plurality of electrode layers comprise:
one or a plurality of selection lines adjacent to an uppermost end of the stack structure, and
a plurality of word lines surrounding the stack structure below the one or plurality of selection lines,
wherein the pillar structure comprises:
a variable resistive layer,
a channel layer between the variable resistive layer and the stack structure,
a gate dielectric layer between the channel layer and the stack structure, and
a blocking pattern disposed between the variable resistive layer and the channel layer and being adjacent to a first selection line among the one or plurality of selection lines.

19. The electronic system according to claim 18, wherein the blocking pattern comprises an air gap, a material having greater resistivity than the channel layer, a material having greater resistivity than the variable resistive layer, or a combination thereof.

20. The electronic system according to claim 18, wherein:
a lowermost end of the blocking pattern is disposed below than a bottom surface of the first selection line among the one or plurality of selection lines; and
an uppermost end of the blocking pattern is disposed higher than a top surface of the first selection line among the one or plurality of selection lines.

* * * * *